(12) United States Patent
Asano et al.

(10) Patent No.: US 6,429,708 B2
(45) Date of Patent: Aug. 6, 2002

(54) SIGNAL OUTPUT DEVICE AND METHOD FOR SENDING SIGNALS AT MULTIPLE TRANSFER RATES WHILE MINIMIZING CROSSTALK EFFECTS

(75) Inventors: Hideo Asano, Machida; Hiroshi Oshikawa, Fujisawa; Tatsuya Sakai, Yamato; Masahiko Sato, Yokohama, all of (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/774,424

(22) Filed: Jan. 31, 2001

(30) Foreign Application Priority Data

Feb. 7, 2000 (JP) ...................... 2000-029103

(51) Int. Cl.⁷ ................................. H03K 5/12
(52) U.S. Cl. ...................... 327/170; 327/172
(58) Field of Search ................ 327/170, 172, 327/112, 427, 430, 431, 432, 437, 379

(56) References Cited

U.S. PATENT DOCUMENTS 5,559,452 A * 9/1996 Saito ........................... 326/88
6,005,890 A * 12/1999 Clow et al. .................. 375/221
6,047,346 A * 4/2000 Lau et al. .................... 710/126
6,069,504 A * 5/2000 Keeth .......................... 327/108
6,141,263 A * 10/2000 Protzman ................ 365/189.11
6,194,935 B1 * 2/2001 Pioppo et al. .............. 327/170

* cited by examiner

*Primary Examiner*—Tuan T. Lam
*Assistant Examiner*—Cassandra Cox
(74) *Attorney, Agent, or Firm*—Abdy Raissinia; Bracewell & Patterson, L.L.P.

(57) ABSTRACT

The signal output device of the present invention comprises of a driver circuit and a controller. The signal sending method of the present invention sets any one of a plurality of the different sending rates. The method also includes setting a slew rate of the driver circuit to a standard value that is in accordance with the predetermined data transfer rate, thereby starting signal transmission. The next step involves determining whether or not a data transfer error occurrence rate is below a predetermined allowable threshold. Then, changes in the slew rate of the driver circuit are made if the data transfer error occurrence rate is determined to be over the allowable threshold. Next, a search for a slew rate value that can decrease the data transfer error occurrence rate below the allowable threshold or decrease the data transfer error occurrence rate is performed. The new slew rate value is set as a new standard value. Finally, the process ends by setting the new standard slew rate for the driver circuit if the slew rate value can decrease the data transfer error occurrence rate below the allowable threshold or decrease the data transfer error occurrence rate.

20 Claims, 13 Drawing Sheets

|  | PIO | Multi-word DMA | Ultra DMA |
|---|---|---|---|
| Mode 0 | 3.3[MB/s] | 8.3[MB/s] | 16.6[MB/s] |
| Mode 1 | 5.2[MB/s] | 11.1[MB/s] | 22.2[MB/s] |
| Mode 2 | 8.3[MB/s] | 16.6[MB/s] | 33.3[MB/s] |
| Mode 3 | 11.1[MB/s] |  | 44.4[MB/s] |
| Mode 4 | 16.6[MB/s] |  | 66.6[MB/s] |
| Mode 5 |  |  | 100[MB/s] |

Fig. 2a

|  | Data Transfer Mode | | | Max. Data Transfer Rate | Min. Data Transfer Rate | Cable |
|---|---|---|---|---|---|---|
|  | PIO | Multi-word DMA | Ultra DMA | | | |
| Legacy ATA | Valid for all modes | Valid for all modes | Not valid | 16.6[MB/s] | 3.3[MB/s] | 40C cable or 80C cable |
| Ultra ATA/33 | | | Valid for up to Mode 2 | 33.3[MB/s] | | |
| Ultra ATA/66 | | | Valid for up to Mode 4 | 66.6[MB/s] | | 80C cable |
| Ultra ATA/100 | | | Valid for up to Mode 5 | 100[MB/s] | | |

Fig. 2b

| SW1 | SW2 | Driver Circuit Slew Rate | Driver Circuit Output Signal Waveform |
|---|---|---|---|
| A | A | sr1 (Max. Value) | |
| A | B | sr2 (<sr1) | |
| B | A | sr2 (<sr1) | |
| B | B | sr3 (<sr2) | |

Fig. 6

| Signal Sending Condition | | Object Slew Rate Value (Standard Value) |
|---|---|---|
| Data Transfer Rate | Cable Type | |
| 66.6[MB/s] | 80C | sr1 (Max.) |
| 44.4[MB/s] | 80C | sr2 |
| 33.3[MB/s] | 80C | sr2 |
| | 40C | sr3 (<sr2) |
| 22.2[MB/s] | 80C | sr4 (<sr3) |
| | 40C | sr5 (<sr4) |
| 16.6[MB/s] | 80C | sr6 (<sr5) |
| | 40C | sr7 (<sr6) |
| ⋮ | ⋮ | ⋮ |

*Fig. 7*

| For Controlling Slew Rate at Start | | For Controlling Slew Rate at End | | | Slew Rate of Driver Circuit |
|---|---|---|---|---|---|
| SW1 | SW2 | SW3 | SW4 | SW5 | SW6 |
| A | A | A | A | A | B | sr1 (Max.) |
| A | A | B | B | A | B | sr2 (<sr1) |
| B | A | B | A | B | B | sr3 (<sr2) |
| A | B | B | B | B | B | sr4 (<sr3) |

Fig. 13

SIGNAL OUTPUT DEVICE AND METHOD FOR SENDING SIGNALS AT MULTIPLE TRANSFER RATES WHILE MINIMIZING CROSSTALK EFFECTS

BACKGROUND OF THE INVENTION

1. Technical Field

The present invention relates to a signal sending system and method that can set a plurality of different data transfer rates and that conforms to an interface standard such as AT Attachment (ATA) or Small Computer System Interface (SCSI). This system and method enables a signal to be sent from a signal output device to a signal receiving device via a signal sending line at a predetermined data transfer rate.

2. Description of the Related Art

A signal sending system with the ability to set a plurality of different data transfer rates and enable a signal to be sent from a signal output device to a signal receiving device via a signal sending line at a predetermined data transfer rate can be used with such peripheral devices as a hard disk drive (HDD), and a CD-ROM drive in a computer system.

Some interface standards used between a signal output (host system) and signal receiving (peripheral) devices in a signal sending system as the one described above include the ATA interface and the SCSI. Those standard interfaces, which include the legacy ATA interface and the Ultra ATA/66 interface, contain a plurality of different interface standards to account for various data transfer procedures and data transfer rates. Also, there are two types of sending cables used for the connection between the output and receiving devices.

The legacy ATA interface supports all the data transfer rates in the PIO data transfer mode and all the data transfer rates in the multi-word DMA data transfer mode. The Ultra ATA/33 interface supports data transfer rates up to 33.3 MB/s of the Ultra DMA data transfer mode. It also allows higher transfer rate interfaces to maintain backward compatibility to the older legacy ATA interface. The Ultra ATA/66 interface supports data transfer rates up to 66.6 MB/s of the Ultra DMA data transfer mode while it enables the Ultra ATA/33 interface to keep its compatibility with higher transfer rate interfaces. Consequently, a signal sending system conforming to the Ultra ATA/66 interface must be able to send signals at 9 types of data transfer rates from 3.3 MB/s to 66.6 MB/s.

The aforementioned ATA interface sends 16-bit parallel data, using 16 data buses. A signal sending system which conforms to the ATA interface uses a flat 40C cable which consists of 40 signal lines (data signal, control signal, and ground lines) or a flat 80C cable, which has 80 signal lines. The 40C cable includes 16 data signal lines placed in parallel. And, because the potentials of those 16 data signal lines are changed simultaneously due to a simultaneous switching by the driver circuit of the signal output device, crosstalk is apt to be generated at a high data transfer rate. To remedy this problem, a ground line is inserted between signal lines in the 80C cable.

Signal integrity is defined as the accuracy of the data/strobe signal between a host system and a peripheral device. The strobe signal is assumed to be the timing reference for latching the data signal. If a latch timing is disturbed and/or a data signal level is changed by a generated noise, a data transfer error occurs, and the signal integrity is considered low. High signal integrity denotes high accuracy of the data/strobe signal between the host system and the peripheral.

Each peripheral and the host system has its own signal I/O device. The signal I/O devices are used to exchange data between the host system and each of the peripherals. A signal I/O device at the data transfer side is used as a signal output device and a signal I/O device at the data receiving side is used as a signal receiving device. Drive circuit signal output devices are used to output signals to signal lines. The drive circuit can output a signal with electrical properties common to all the possible data transfer rates and all the usable cable types (40C and 80C cables).

SUMMARY OF THE INVENTION

The signal output device of the present invention is able to set a plurality of different data transfer rates and output a signal to a signal receiving device via a signal sending line at a predetermined data transfer rate. The signal output device consists of a driver circuit which can set a plurality of different slew rates and output the signal to the signal sending line at a predetermined slew rate, and a controller that sets a slew rate of the driver circuit according to the predetermined data transfer rate.

The signal sending method of the present invention sets any one of a plurality of the different sending rates, thereby enabling a signal to be sent to a signal receiving device from a signal output device via a signal sending line at the predetermined data transfer rate. When a driver circuit is included with the above mentioned signal output device, the driver circuit can set a plurality of different slew rates and output the signal to the signal sending line at a predetermined slew rate. A controller is also included in the signal output device to set a slew rate of the driver circuit according to the predetermined data transfer rate. The signal transmission method includes the following steps:

setting a slew rate of the driver circuit to a standard value that is in accordance with the predetermined data transfer rate, thereby starting signal transmission;

determining whether or not the data transfer error occurrence rate is below a predetermined allowable threshold. This threshold is the data transfer error occurrence being caused by a signal sent to the signal receiving device from the driver circuit;

changing the slew rate of the driver circuit if the data transfer error occurrence rate is determined to be over the allowable threshold Eth;

searching for a slew rate value that can decrease the data transfer error occurrence rate below the allowable threshold or decrease the data transfer error occurrence rate;

setting the slew rate value as a new standard value; and setting the new standard slew rate for the driver circuit if the slew rate value can decrease the data transfer error occurrence rate below the allowable threshold or decrease the data transfer error occurrence rate.

BRIEF DESCRIPTION OF THE DRAWINGS

FIG. 2 depicts tables for describing an ATA interface standard in accordance with a preferred embodiment of the present invention;

FIG. 6 illustrates a table which describes the operation of the driver circuit in accordance with a preferred embodiment of the present invention;

FIG. 7 is a block diagram of a slew rate setting table of a driver circuit included in the signal output device according to a preferred embodiment of the present invention;

FIG. 13 depicts a table for describing the operation of the driver circuit in accordance with a preferred embodiment of the present invention.

DETAILED DESCRIPTION OF THE PREFERRED EMBODIMENT

Figure 1:
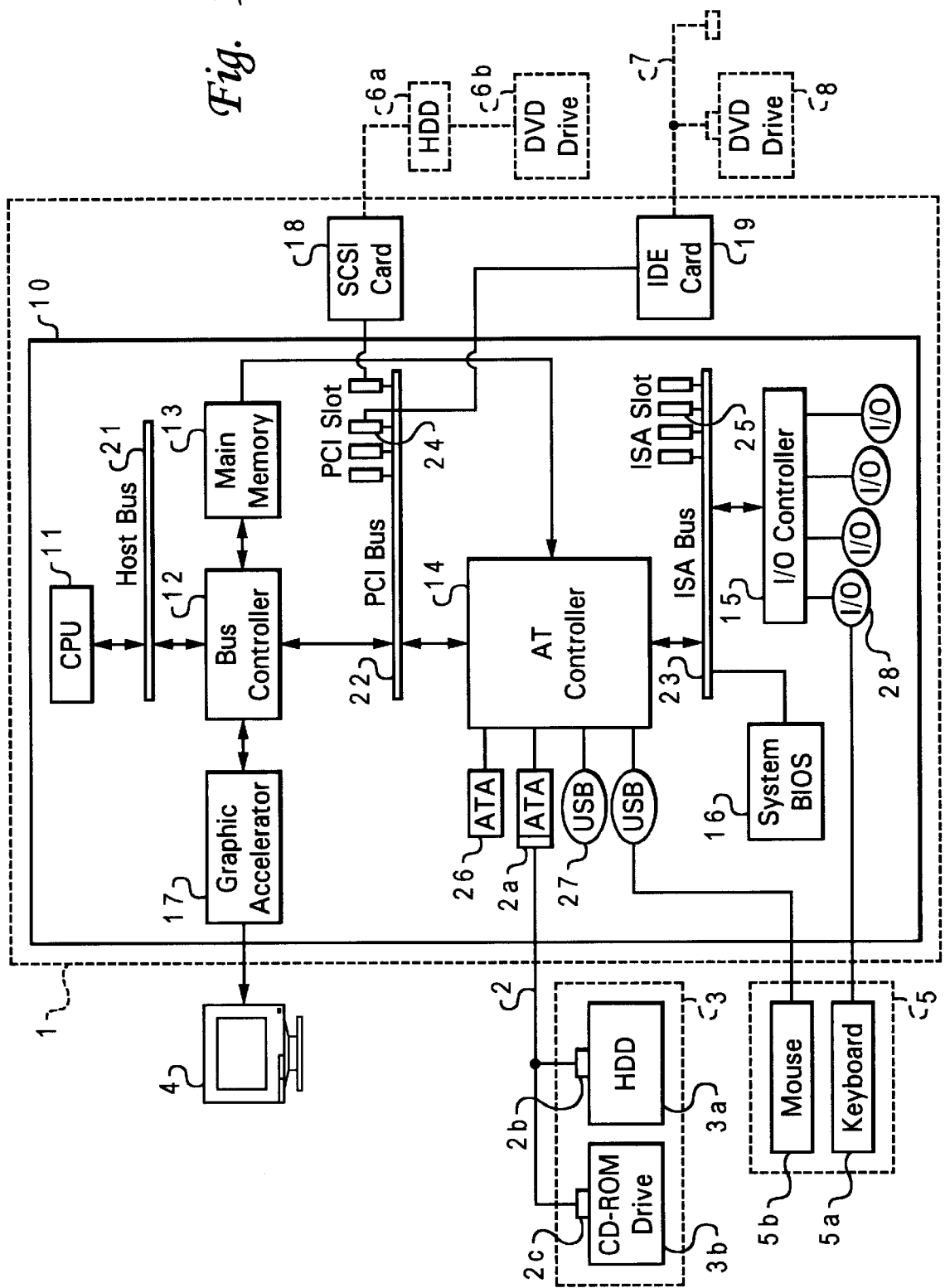
FIG. 1 is a block diagram of a computer system in accordance with a preferred embodiment of the present invention.

With reference to FIG. 1, a block diagram of a computer system in which a preferred embodiment of the present invention may be embodied is depicted. The computer system illustrated in FIG. 1 includes host system 1, ATA (AT Attachment) flat cable (IDE: Integrated Device(Drive) Electronics) flat cable) 2, such peripheral devices 3 such as hard disk drive (HDD) 3a and CD-ROM drive 3b, display 4, and data input devices 5 such as keyboard 5a and mouse 5b Host system 1 controls the whole computer system illustrated in FIG. 1. Host system 1 includes mother board 10 with a mounted chip set, including CPU (Central Processing Unit) chip 11.

CPU chip 11, bus controller chip 12, main memory 13, an AT controller chip, Industry Standard Architecture (ISA) controller chip 14, I/O controller chip 15, system BIOS chip (ROM) 16, graphics accelerator (chip or card) 17, such Peripheral Component Interconnect (PCI) expansion cards as SCSI card 18, or IDE card 19 are mounted on motherboard 10.

Mother board 10 includes host bus 21, PCI bus 22, ISA bus (AT bus) 23, PCI slots 24, ISA slots (AT slots) 25, ATA port (IDE port) 26, USB (Universal Serial Bus) ports 27, and I/O ports 28.

Host bus 21 is located between CPU 11 and bus controller 12. For example, bus 21 includes a 32-bit parallel data bus and a 40-bit parallel control bus.

PCI bus 22 connects bus controller 12, AT controller 14, and PCI slots 25. PCI bus 22 includes a 32-bit parallel bus to be used by both data and control signals. Such PCI expansion cards as a SCSI card 18 and IDE card 19 are inserted in PCI slots 22. Such peripheral devices as HDD 6a or a CD-ROM drive which conform to the SCSI interface standard can be connected to SCSI card 18. Such ATA interface standard conforming peripheral devices such as a HDD, CD-ROM drive, and DVD drive 8 can be connected to IDE card 19 via IDE cable (ATA cable) 7.

ISA bus 23 connects AT controller 14, I/O controller 15, system BIOS chip 16, and ISA slots 25. ISA bus 23 includes a 16-bit parallel data bus and a 24-bit parallel control bus. ISA bus 23 also conforms to the ATA interface standard. System BIOS chip 16 contains the information required for initial operation of the computer system during system startup. ISA slot 25 accepts ISA expansion cards. I/O controller 15 controls data transfer between ISA bus 23 and each I/O port 28. Such data input devices as keyboard 5a and a mouse and output devices such as a printer are connected to I/O ports 28. Keyboard 5a is connected to an I/O port 28, as illustrated in FIG. 1.

Bus controller 12 is connected to main memory 13, PCI bus 22, and graphics accelerator 17. Bus controller 12 is also connected to CPU 11 via host bus 21 to control data transfer between CPU 11 and main memory 13, PCI bus 22 or the graphics accelerator 17, as well as between main memory 13 and PCI bus 22 or graphics accelerator 17, and between PCI bus 22 and graphics accelerator 17. Display 4 is connected to graphics accelerator 17.

AT controller 14 is connected to main memory 13, PCI bus 22, ISA bus 23, ATA ports 26, and USB ports 27. AT controller 14 controls data transfer between main memory 13 and ATA port 26 or USB ports 27 or ISA bus 23, as well as between PCI bus 22 and ATA port 26 or USB ports 27 or ISA bus 23. Such peripheral devices 3 as HDD 3a and CD-ROM drive 3b are connected to ATA port 26 via ATA cable 2. With reference to FIG. 1, HDD 3a and CD-ROM drive 3b are connected to one ATA cable 2. Such data input devices as mouse 5b and keyboard 5a are connected to USB ports 27. Referring to FIG. 1, mouse 5b is connected to a USB port 27.

ATA flat cable 2 which conforms to the ATA interface is connected to ATA port 26. Peripheral devices 3 that also conform to the ATA interface are connected to the ATA port via ATA cable 2. Up to two peripheral devices can be connected to one ATA port 26 via one ATA cable 2. Host system 1 and peripheral devices 3 utilize a signal I/O device which conforms to the ATA interface. The signal I/O device of host system 1, ATA cable 2, and signal I/O device of HDD 3a are combined to make up a signal sending system which also conforms to the ATA interface. Also, the signal I/O device of host system 1, ATA cable 2, and signal I/O device of the CD-ROM drive 3b are combined to compose a signal sending system which also conforms to the ATA interface.

A signal sending system which is compatible which the ATA interface enables bi-directional signal sending. For example, when data is sent from HDD 3a to host system 1, the signal I/O device of HDD 3a is assumed to be a signal output device for sending a signal to ATA cable 2 and the signal I/O device of host system 1 is assumed to be a signal receiving device for receiving a signal from ATA cable 2.

The above ATA interface sends 16-bit parallel data with use of 16 data buses. The ATA cable 2 which conforms to the ATA interface is divided into 40-core flat cable (16 data signal, control signal, and ground lines) described as a 40C cable, and 80-core flat cable described as a 80C cable. The 80C cable is obtained by adding 40 ground lines to a 40C cable. In the 80C cable, a ground line is placed between signal lines, reducing crosstalk during high speed data transfer.

With reference to FIG. 2, the ATA interface standard is illustrated. FIG. 2a depicts data transfer rates in ATA interface standard data transfer modes, as well as a data transfer rate in each data transfer mode. FIG. 2b illustrates data transfer modes supported by each ATA interface, the maximum and minimum data transfer rate supported by each ATA interface, and the cable types used by each ATA interface.

As illustrated in FIG. 2, there are 3 modes for the ATA interface data transfer mode: PIO (Program Input/Output), multi-word DMA (Direct Memory Access), and Ultra DMA data. The PIO data transfer is a method that CPU 11 of host system 1 utilizes to access ATA port 26 directly, thereby sending data. The data sent from ATA port 26 is received by main memory 13 via CPU 11. The DMA data transfer (multi-word DMA data transfer and Ultra DMA data transfer) is a method where data is sent directly between main memory 13 and a peripheral device 3 such as HDD 3a without using CPU 11. The reduction load of CPU 11 is more pronounced than in the PIO data transfer method.

The ATA interface sends data signals with use of the data signal lines of ATA cable 2 and a strobe signal with use of the strobe signal line of ATA cable 2. The strobe signal is assumed to be a timing reference for latching the data signal in the signal receiving device.

The multi-word DMA data transfer method latches a data signal at the start of the strobe signal. The Ultra DMA data transfer method latches a data signal at both rising edge and falling edge of the strobe signal, thereby achieving a data transfer rate double that of the multi-word DMA data transfer method.

Referring to FIG. 2a, the data transfer rates in the above PIO data transfer mode are:

Mode 0=3.3 MB/s,
Mode 1=5.2 MB/s,
Mode 2=8.3 MB/s,
Mode 3=11.1 MB/s, and
Mode 4=16.6 MB/s.

The data transfer rates in the above multi-word DMA data transfer mode are:

Mode 0=8.3 MB/s,
Mode 1=11.1 MB/s, and
Mode 2 =16.6 MB/s.

The data transfer rates in the above Ultra DMA data transfer mode are:

Mode 0=16.6 MB/s,
Mode 1=22.2 MB/s,
Mode 2=33.3 MB/s,
Mode 3=44.4 MB/s,
Mode 4=66.6 MB/s, and
Mode 5=100 MB/s.

Referring to FIG. 2b, the ATA interface standard includes the legacy ATA interface, the Ultra ATA/33 interface, the Ultra ATA/66 interface, and the Ultra ATA/100 interface.

The legacy ATA interface supports every mode (modes 0–4) of the PIO data transfer method and every mode (modes 0–2) of the multi-word DMA data transfer method. The Ultra ATA/33 interface supports data transfer rates of 16.6 MB/s (mode 0), 22.2 MB/s (mode 1), 33.3 MB/s (mode 2) in the Ultra DMA data transfer mode while enabling the legacy ATA interface to keep its compatibility with higher transfer rate interfaces. The Ultra ATA/66 interface supports the data transfer rates of 44.4 MB/s (mode 3) and 66.6 MB/s (mode 4) in the Ultra DMA data transfer mode while enabling the legacy ATA interface and the Ultra ATA/33 interface to keep its compatibility with higher transfer rate interfaces. In addition, the Ultra ATA/100 interface supports the data transfer rate of 100 MB/s (mode 5) in the Ultra DMA data transfer mode while enabling the Ultra ATA/66 interface to keep its compatibility with higher transfer rate interfaces.

Consequently, a signal sending system which conforms to the Ultra ATA/66 interface must be able to send a signal at 9 data transfer rates from 3.3 to 66.6 MB/s. And, a signal sending system which conforms to the Ultra ATA/100 interface must be able to send a signal at 10 data transfer rates from 3.3 to 100 MB/s.

Although a 40C or 80C cable can be used for data transfer rates within 33.3 MB/s, a 80C cable must be used for data transfer rates at 44.4 MB/s or higher. Therefore, the legacy ATA interface and the Ultra ATA/33 interface, even when a 40C cable is used, can set the maximum data transfer rate, but the Ultra ATA/66 interface and the Ultra ATA/100 interface can set their maximum data transfer rates of 66.6 or 100 MB/s only when a 80C cable is used. If a 40C cable is used, the data transfer rate is set to 33.3 MB/s or lower.

The AT Attachment Packet Interface (ATAPI) is also another type of ATA interface. For the ATAPI, only the command sending protocol is changed from that of the ATA interface. The data transfer modes, the data transfer rates, and the cable types are the same between the ATA interface and the ATAPI interface. Either the ATA interface or the ATAPI interface is selected according to the type of peripheral device. For example, the ATA interface is used for data transfer between the host system and an HDD and the ATAPI interface is used for data transfer between the host system and a CD-ROM drive.

Figure 3:
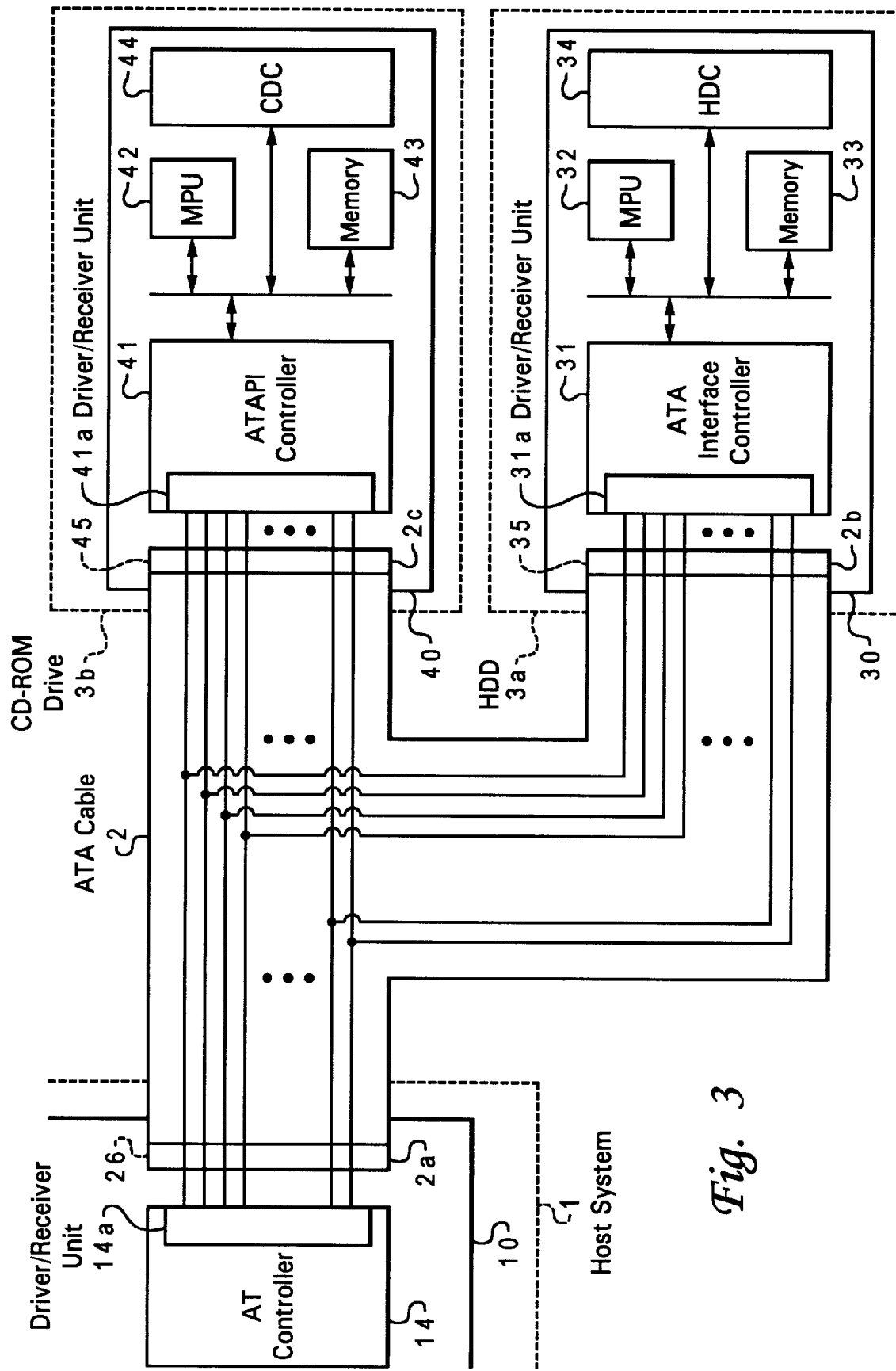
FIG. 3 is a block diagram of a signal sending system which conforms to the ATA interface in accordance with a preferred embodiment of the present invention. This system is composed of a signal I/O device of a host system, an ATA cable, and the signal I/O device of a peripheral device.

With reference to FIG. 3, a block diagram of a signal sending system, which conforms to the ATA interface, is illustrated. The system comprises a signal I/O device of host system 1, ATA cable 2, and a signal I/O device of peripheral device 3.

With reference to FIG. 3, HDD 3a,which conforms to the ATA interface, utilizes ATA interface controller 31 with driver/receiver unit (DRU) 31a connected to ATA cable 2, MPU (Micro Processing Unit) 32 for controlling the whole HDD, memory 33, hard disk (magnetic disk), and a mechanism for reading the hard disk, and HDC (Hard Disk Controller) 34 for controlling the accessing mechanism. HDD 3a records data received from host system 1 on a hard disk, regenerates data from the hard disk, and sends the data to host system 1. ATA interface controller 31, MPU 32, memory 33, and HDC 34 are mounted on card (printed board) 30.

HDD 3a uses a signal I/O device to control signal exchanges with host system 1 via the ATA interface, outputs a signal to ATA cable 2, and receives a signal from ATA cable 2. The signal I/O device of HDD 3a includes ATA interface controller 31, MPU (Micro Processing Unit) 32, and memory 33. ATA interface controller 31 includes driver/receiver unit 31a, which is connected to ATA cable 2.

CD-ROM drive 3b conforms to the ATA interface and accesses ATAPI controller 41, which has driver/receiver unit 41a connected to ATA cable 2, MPU 42 for controlling the whole CD-ROM drive, memory 43, a mechanism for accessing the loaded CD-ROM, and CDC (Compact Disk Controller) 44 for controlling the accessing mechanism.

CD-ROM drive 3b regenerates data recorded on the CD-ROM and sends the data to host system 1. ATAPI controller 41, MPU 42, memory 43, and CDC 44 are mounted on card (printed board) 40. The CD-ROM drive may be of a type that can record data received from host system 1 on a CD-ROM.

CD-ROM drive 3b accesses signal I/O device to control signal exchanges with host system 1 via the ATA interface, outputs a signal to ATA cable 2, and receives a signal from ATA cable 2. The signal I/O device of CD-ROM drive 3b includes ATAPI controller 41, MPU 42, and memory 43.

Host system 1 accesses signal I/O device to control signal exchanges with peripheral device 3 (HDD 3a or CD-ROM drive 3b) via the ATA interface, outputs a signal to ATA cable 2, and receives a signal from ATA cable 2. The signal I/O device of host system 1 includes AT controller 14, with a driver/receiver unit 14a connected to ATA cable 2, CPU 11, and main memory 13.

At one end of ATA cable 2, connector 2a is used to connect ATA port 26 of host system 1. At a middle section, and the other end of ATA cable 2, connectors 2b and 2c are used to connect the IDE ports on the cards of peripheral devices 3. With reference to FIG. 3, connector 2b is connected to IDE port 35 on the card 30 of HDD 3a. Connector 2c is connected to IDE port 45 on located on card 40 of CD-ROM drive 3b.

The signal lines of the ATA cable are connected to driver/receiver unit 14a of AT controller 14 via connector 2a and ATA port 26. Also connected to the signal lines are driver/receiver unit 35a of ATA interface controller 31 via connector 2b and IDE port 35 and further attached to driver/receiver unit 45a of ATAPI controller 41 via connector 2c and IDE port 45.

The 40C cable is comprised of 16 signal and 24 control signal lines (including 3 strobe signal and one ground line) oriented side by side.

The 80C cable is comprised of 16 signal and 64 control signal lines (including 3 strobe signal lines and 41 ground lines) oriented side by side.

The 80C cable is constructed by adding 40 ground lines to the 40C cable so that a ground line is situated between signal lines. This reduces crosstalk in high speed data transfer. In connectors 2a, 2b, and 2c, the additional ground lines are connected to the ground line in the 40C cable. Consequently, the connectors 2a, 2b, and 2c for both 40C and 80C cables each have 40 pins. Any of the 40C and 80C cables can be connected to ATA port 26 and IDE ports 35 and 45.

Figure 4:
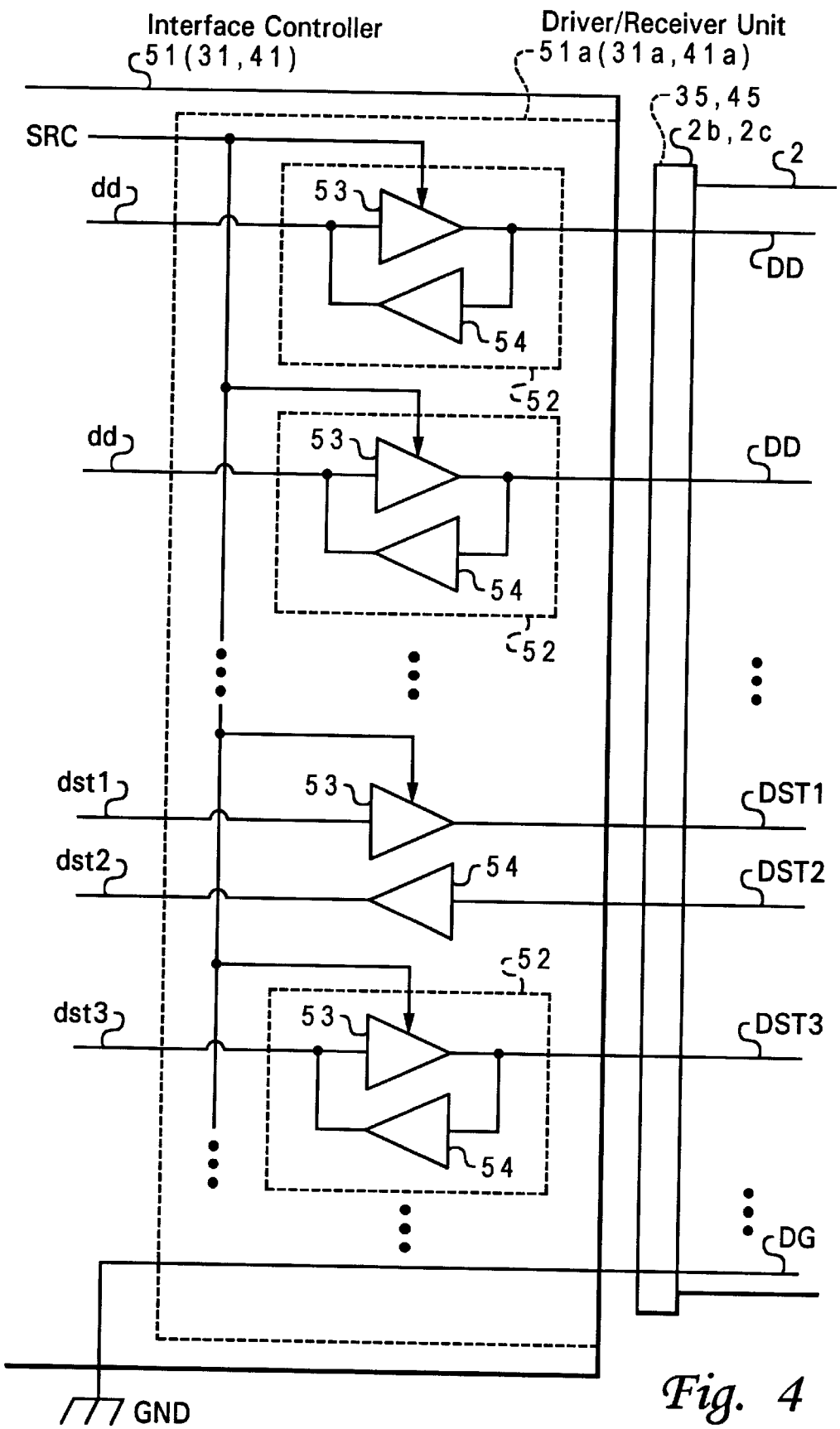
FIG. 4 is a circuit diagram of a driver/receiver unit of a peripheral device in accordance with a preferred embodiment of the present invention.

Referencing FIG. 4, the circuit diagram illustrates driver/receiver unit 51a (31a or 41a) of peripheral device 3. Driver/receiver unit 51a in interface controller 51 (ATA interface controller 31 or ATAPI controller 41) of peripheral device 3 is constructed so that driver/receiver circuit 52, driver circuit 53, and receiver circuit 54 are between the signal lines of ATA cable 2. The signal lines of the interface controller 51 correspond to the signal lines of ATA cable 2. Driver circuit 53 outputs a signal to ATA cable 2. The signal is sent to the signal I/O device of host system 1 from peripheral device 3. Receiver circuit 54 receives the signal output to ATA cable 2 from the signal I/O device of host system 1.

Driver/receiver circuit 52 accesses driver circuit 53 and receiver circuit 54. It receives a signal from ATA cable 2 via receiver circuit 54 and outputs a signal to ATA cable 2 via driver circuit 53. The signal received from the ATA cable 2 is an output from the signal output device of host system 1 and the signal output to ATA cable 2 is a signal sent from peripheral device 3 to host system 1. Driver/receiver circuit 52, when peripheral device 3 sends data to host system 1, is controlled by interface controller 51 so that only driver circuit 53 is activated (circuit 52 can be assumed to access only driver circuit 53 at this time.) When host system 1 sends data to peripheral device 3, driver/receiver circuit 52 is controlled by interface controller 51 so that only receiver circuit 54 is activated (circuit 52 can thus be assumed to access only the driver circuit at this time).

The 16 data signal lines DD of ATA cable 2 are bi-directional lines used to send data signals to peripheral device 3 from host system 1, and vice versa. On the contrary, the strobe signal line DST1 (referred to as "IORDY") is a one-way signal line used to send a strobe signal from peripheral device 3 to host system 1 in the Ultra DMA data transfer mode. The strobe signal line DST2 (referred to as "DIOW-") is a one-way signal line used to send a strobe signal from host system 1 to peripheral device 3 in the PIO data transfer mode and in the multi-DMA data transfer mode. Strobe signal line DST3 (referred to as "DIOR-") is a one-way signal line used to send a strobe signal from peripheral device 3 to host system 1 in the PIO and multi-DMA data transfer modes. DST3 is also used to send a signal from host system 1 to peripheral device 3 in the Ultra DMA data transfer mode.

In driver/receiver unit 51a, driver/receiver circuit 52 is used for the bi-directional signal sending line of ATA cable 2. Only driver circuit 53 or receiver circuit 52 is used for the one-way signal sending line of ATA cable 2.

The input terminals of driver circuit 53 are connected to signal lines (data signal DD, strobe signals DST, DST2, and DST3) corresponding to interface controller 51. The output terminals of driver circuit 53 are connected to signal lines (data signal DD, strobe signals DST2 and DST3) corresponding to ATA cable 2 via IDE ports 35 and 45, as well as peripheral device connection connectors 2b and 2c. The input terminals of receiver circuit 54 are connected to the signal lines (data signal DD, strobe signal DST2 and DST3) corresponding to the ATA cable 2 via the IDE ports 35 and 45, as well as the peripheral device connection connectors 2b and 2c. The output terminals of the receiver circuit 54 are connected to the signal lines (data signal lines DD, strobe signal lines DST2 and DST3) corresponding to interface controller 51. The ground line DG of ATA cable 2 is connected to ground pattern GND of the card (card 30 or 40 illustrated in FIG. 3) of peripheral device 3 via interface controller 51.

Driver/receiver unit 14a of host system 1 in the circuit diagram is almost the same as driver/receiver unit 51a shown in FIG. 4. In unit 14a, however, the configuration of driver circuit 53 and receiver circuit 54 is changed from that of driver/receiver unit 51a of peripheral device 3 with respect to each one-way signal sending line of ATA cable 2. For example, receiver circuit 54 is for strobe signal line DST1 and driver circuit 53 is for strobe signal line DST2.

In a signal sending system, which conforms to the ATA interface, as depicted in FIG. 3, the higher the data transfer rate and the larger the driver circuit slew rate, the more the number of switching times per output signal time is increased and the sharper the potential change with respect to the output signal time becomes. The slew rate is a potential change rate with respect to an output signal time when the subject driver circuit changes the potential of an output signal according to the potential change of an input signal. The unit of the change rate is V/ns. Consequently, as the crosstalk effects in ATA cable 2 are increased, the signal integrity becomes more degraded. If a low data transfer rate is set, for example, to 3.3 MB/s, then a driver circuit of a small slew rate is used so that the potential of the output signal has little change. With this, crosstalk is reduced, and the signal integrity is improved. If such a high data transfer rate as 66.6 MB/s or 100 MB/s is set, however, changes of the output signal cannot match the changes of the input signal in the driver circuit of a small slew rate as described above. Thus, the output signal cannot keep the "low" level period or "high" level period long enough and the signal integrity is degraded.

A conventional signal output device has a large slew rate driver circuit to compensate for the maximum data transfer rate. The driver circuit with a fixed slew rate is most commonly used for all the possible data transfer rates. The Ultra ATA/66 interface and the Ultra ATA/100 interface must use the 80C cable to reduce crosstalk.

In this case, however, it is unknown what kind of a host system will communicate with a signal sending system and what peripheral devices are employed. If an HDD with a driver circuit is designed to utilize the 80C cable and a 100 MB/s data transfer rate is connected to a host system via a 40C cable, large crosstalk effects will be generated and this will heavily degrade signal integrity.

The signal output device in a preferred embodiment has driver circuit 53 that can set a plurality of different slew rates and can output a signal at a predetermined slew rate, as well as a controller that can set a slew rate of driver circuit 53 according to the signal sending condition consisting of the predetermined data transfer rate. The appropriate type of cable must be in use to insure that the device can be set at the optimum slew rate for the signal sending condition.

In HDD 3a, ATA interface controller 31 and MPU 32 are combined to create the above mentioned controller. In CD-ROM drive 3b, ATAPI controller 41 and MPU 42 are combined to create the controller. In host system 1, the controller is comprised of AT controller 14 and CPU 11. As depicted in FIG. 4, the slew rate of driver circuit 53 in a preferred embodiment is set to the best value according to the signal sending condition in response to control signal SRC entered from the controller.

Driver circuit 53 in a preferred embodiment is mounted on one IC (integrated circuit) with part of the controller (ATA interface controller 31, ATAPI controller 41, or AT controller 14). However, driver circuit 53 can be integrated on one IC chip with the entire controller.

Figure 5:
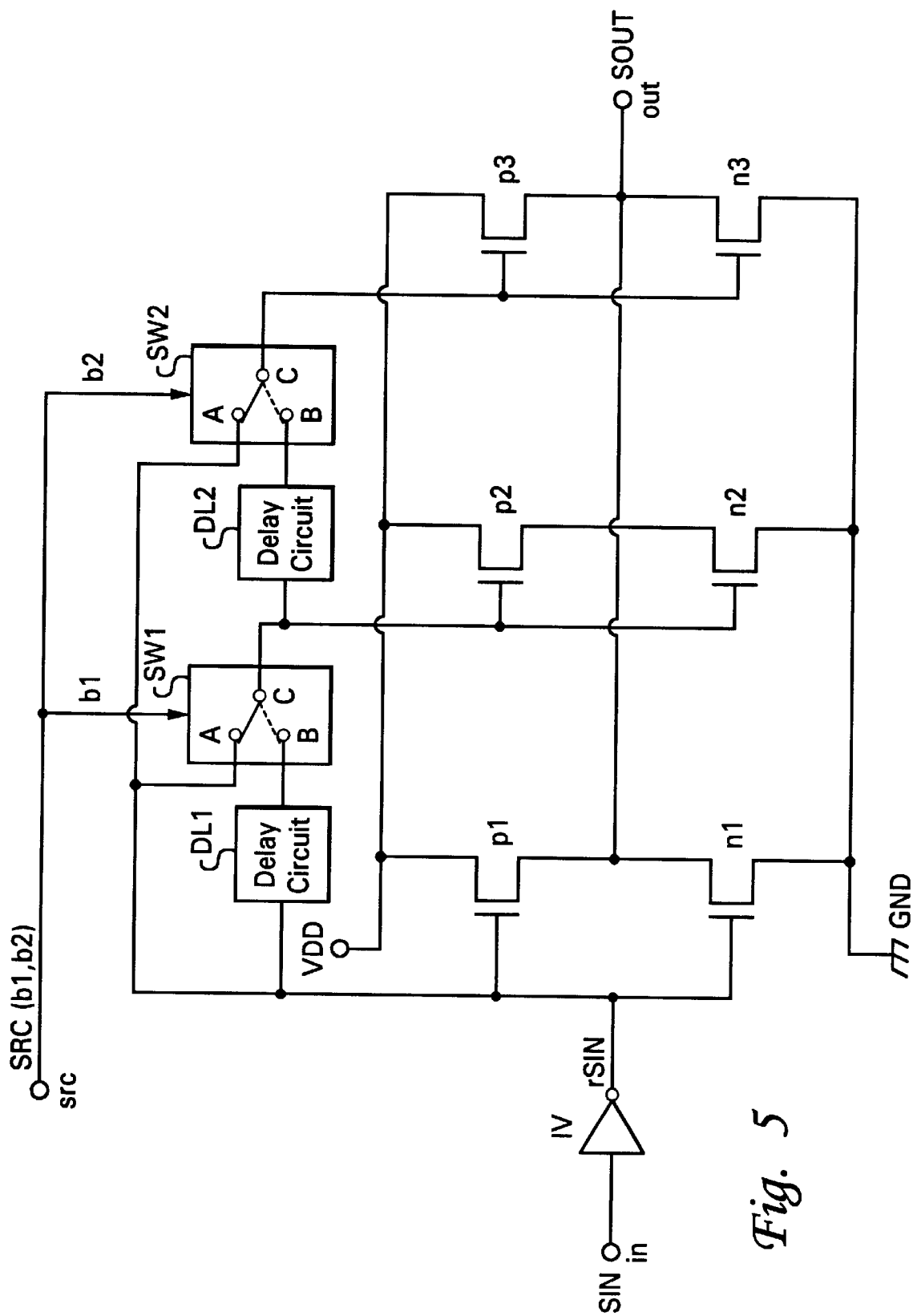
FIG. 5 is a circuit diagram of a driver circuit provided in the signal output device in accordance with a preferred embodiment of the present invention.

FIG. 5 depicts a circuit diagram of driver circuit 53 in the signal output device in a preferred embodiment according to the present invention. With reference to FIG. 5, driver circuit 53 consists of pMOS transistors (p1, p2, and p3), nMOS transistors (n1, n2, and n3), delay circuits (DL1 and DL2), switching circuits (SW1 and SW2), and an inverter (IV).

Driver circuit 53, illustrated in FIG. 5, can set a plurality of different slew rates when it adjusts the switching timings of the three CMOS inverters consisting of transistors p1 to p3 and n1 to n3. Comprised of delay circuits DL1 and DL2, and switching circuits SW1 and SW2 the driver circuit can set the slew rate if the switching timings of the three CMOS inverters are delayed by a time corresponding to the values of the bits b1 and b2 of the slew rate control signal SRC.

Inverter IV inverts transmit signal SIN entered to the signal input terminal "in" from interface controller 51, thereby supplying inverted transmit signal rSIN to the gate electrodes of transistors p1 and n1, the input terminal of delay circuit DL1, and terminal A of switching circuits SW1 and SW2.

Delay circuit DL1 delays entered transmit signal rSIN and supplies the delayed signal to terminal B of switching circuit SW1. Delay circuit DL2 delays a signal supplied from terminal C of switching circuit SW1 and supplies the delayed signal to terminal B of switching circuit SW2. In this case, the signal delay time delayed by each of delay circuits DL1 and DL2 is assumed to be T.

Slew rate control signal SRC entered to terminal src from the interface controller is used to set a slew rate of the driver circuit. It is a 2-bit signal comprising of bits b1 and b2. Bit b1 is entered to switching circuit SW1 and bit b2 is entered to switching circuit SW2.

Switching circuit SW1 connects terminal C to either terminal A or B, depending on the logical value of bit b1 of slew rate control signal SRC. In this case, switching circuit SW1 connects terminal C to terminal A at b1="0," thereby transmit signal rSIN is supplied to the gate electrodes of transistors p2 and n2, as well as to the input terminal of delay circuit DL2. At b1="1," switching circuit SW1 connects terminal C to terminal B, thereby transmit signal rSIN is delayed by a time T and the delayed signal is supplied to the gate electrodes of transistors p2 and n2, as well as to the input terminal of delay circuit DL2.

Switching circuit SW2 connects terminal C to terminal A or B depending on the value of bit b2 of slew rate control signal SRC. The signal supplied to terminal B of switching circuit SW2 is varied according to the setting of switching circuit SW1. The signal is delayed by a time T or (2×T) from transmit signal rSIN. In this case, switching circuit SW2 connects terminal C to terminal A at b2="0," thereby transmit signal rSIN is supplied to the gate electrodes of transistors p3 and n3. At b2="1," switching circuit SW2 connects terminal C to terminal B, thereby delaying the signal by a time T or (2×T) from transmit signal rSIN and the delayed signal is supplied to the gate electrodes of transistors p3 and n3.

The source electrodes of transistors p1 to p3 are connected to power supply VDD and the drain electrodes of those transistors are connected to output terminal "out." The source electrodes of transistors n1 to n3 are connected to ground GND and the drain electrodes of those transistors are connected to output terminal "out." Output terminal "out" is connected to AT cable 2 (refer to FIGS. 3 and 4) and transmit signal SOUT output from driver circuit 53 at a predetermined slew rate is supplied to AT cable 2.

The current driving performance (mutual conductance is an index of the current driving performance) should preferably be identical in both transistors p1 and n1, in both transistors p2 and n2, and in both transistors p3 and n3 respectively. In addition, the threshold should be the same in both transistors p1 to p3, as well as in both n1 to n3. In this case, it is assumed that the current driving performance is the same among transistors p1 to p3, and among transistors n1 to n3.

The CMOS inverter, composed of transistors p1 and n1, is always switched according to a change of transmit signal rSIN. The CMOS inverter, composed of transistors p2 and n2, when switching circuit SW1 is set to terminal A, is switched at the same timing as that of transistors p1 and n1 according to a change of transmit signal rSIN. When switching circuit SW1 is set to terminal B, however, the CMOS inverter is switched at a timing delayed by a time T from the switching timing of transistors p1 and n1 according to a change of a signal delayed by a time T from inverted transmit signal SIN. The CMOS inverter composed of transistors p3 and n3 is switched at any one of the same timing as that of transistors p1 and n1, a timing delayed by a time T from that of transistors p1 and n1, and a timing delayed by a time (2×T) from that of transistors p1 and n1 according to setting of switching circuits SW1 and SW2.

With reference to FIG. 6, the operation of driver circuit 53 and the correspondence among the settings of switching circuits SW1 and SW2, the slew rate values, and output signal waveforms is shown. The output signal waveforms illustrated in FIG. 6 are explanatory ones for describing changes of slew rates.

As depicted in FIG. 6, a slew rate can be set in three steps of sr1 (maximum), sr2 (<sr1), and sr3 (<sr2) according to slew rate control signal SRC in driver circuit 53. Transmit signal SOUT has an adjusted slew rate, which is supplied to the AT cable from driver circuit 53. Signal SOUT and signal SIN entered to driver circuit 53 are identical in phase.

If b1=b2="0" is set in slew rate control signal SRC and both switching circuits SW1 and SW2 are set to terminal A, then inverted transmit signal rSIN is supplied to the gate electrodes of transistors p1 to p3, as well as n1 to n3.

If the level of transmit signal SIN is changed from Low (hereafter, to be described as "L") to High (hereafter, to be described as "H"), transistors p1 to p3 are simultaneously turned on and transistors n1 to n3 are simultaneously turned off at a time tr when the voltage of inverted transmit signal rSIN falls to the threshold. With the switching operations of those transistors, the level of transmit signal SOUT is changed from "L" to "H."

If the level of transmit signal SIN is changed from "H" to "L," transistors p1 to p3 are simultaneously turned off and transistors n1 to n3 are simultaneously turned on at a time tf when the voltage of inverted transmit signal rSIN rises to the threshold. With the switching operations of those transistors, the level of transmit signal SOUT is changed from "H" to "L."

Consequently, if b1=b2="0" is set for slew rate control signal SRC, driver circuit 53 drives the AT cable with the maximum current driving performance of driver circuit 53 obtained by transistors p1 to p3 between times tr and tf and drives AT cable 2 with the maximum current driving performance of driver circuit 53 obtained by transistors p1 to p3 between times tf and tr.

Consequently, the slew rate of driver circuit 53 takes the maximum value sr1. Transmit signal SIN thus begins rising from the "L" level at time tr, then keeps rising at a slew rate of sr1 to reach the "H" level. Transmit signal SIN begins falling from the "H" level at time tf, then keeps falling at a slew rate of sr1 to reach the "L" level.

If b1="0" and b2="1" are set for slew rate control signal SRC and switching circuit SW1 is set to terminal A and switching circuit SW2 is set to terminal B, then inverted transmit signal rSIN is supplied to the gate electrodes of transistors p1, p2, n1, and n2 and a signal delayed by a time T from inverted transmit signal rSIN is supplied to the gate electrodes of transistors p3 and n3 respectively.

If the level of transmit signal SIN is changed from "L" to "H," transistors p1 and p2 are turned off and transistors n1 and n2 are turned on at time tr. And, transistor p3 is turned on and transistor n3 is turned off at the following timing (tr+T). With the switching operations of those transistors, the level of transmit signal SOUT is changed from "L" to "H."

If the level of transmit signal SIN is changed from "H" to "L," transistors p1 and p2 are turned off and transistors n1 and n2 are turned on at time tr and transistor p3 is turned off and transistor n3 is turned on at the following time (tr+T). With the switching operations of those transistors, the level of transmit signal SOUT is changed from "H" to "L."

Consequently, if b1="0" and b2="1" are set for slew rate control signal SRC, driver circuit 53 drives AT cable 2, according to the state of transistors p1 and p2 between time tr and time (tr+T). Driver circuit 53 drives the AT cable 2 with its maximum current driving performance obtained by the transistors p1 to p3 between the time (tr+T) and the following time tf. Also, driver circuit 53 drives AT cable 2 according to the state of transistors n1 and n2 between time tf and time (tf+T) and drives AT cable 2 with its maximum current driving performance obtained by transistors n1 to n3 between time (tf+T) and the following timing tr.

Because the current driving performance is adjusted during a level change of transmit signal SIN by delaying the switching timing of transistors p3 and n3 by a time T in this way, the slew rate of driver circuit 53 takes a value of sr2(<sr1). Transmit signal SIN thus begins rising from the "L" level at time tr and keeps rising at a slew rate of sr2 to reach the "H" level. And, transmit signal SIN begins falling from the "H" level at time tf and keeps falling at a slew rate of sr2 to reach the "L" level.

The slew rate of driver circuit 53 also takes a value of sr2 when b1="1" and b2="0" are set for slew rate control signal SRC and switching circuit SW1 is set to terminal B and switching circuit SW2 is set to terminal A. This is the same as the slew rate when b1="0" and b2="1" are set. When b1="1" and b2="0" are set, the operations of transistors p2 and p3, as well as the operations of transistors n2 and n3 are reversed from those when b1="0" and b2="1" are set.

If b1=b2="1" is set for slew rate control signal SRC and switching circuits SW1 and SW2 are set to terminal B, inverted transmit signal rSIN is supplied to the gate electrodes of transistors p1 and n1 and a signal delayed by a time T from inverted transmit signal rSIN is supplied to the gate electrodes of transistors p2 and n2 and a signal delayed by a time (2×T) from inverted transmit signal rSIN is supplied to the gate electrodes of transistors p3 and n3.

If the level of transmit signal SIN is changed from "L" to "H", transistor p1 is turned on and transistor n1 is turned off at time tr and transistor p2 is turned on and transistor n2 is turned off at the following time (tr+T). And, transistor p3 is turned on and transistor n3 is turned off further at the following time (tr+2×T). With the switching operations of those transistors, the level of transmit signal SOUT is changed from L to H.

If the level of transmit signal SIN is changed from "H" to "L," transistor p1 is turned off and transistor n1 is turned on at time tr and transistor p2 is turned off. Transistor n2 is turned on at the following time (tr+T), and transistor p3 is turned off. Transistor n3 is turned on further at the following time (tr+2×T). With the switching operations of this transistors, the level of the transmit signal SOUT is changed from H to L.

Consequently, if b1=b2="1" is set for slew rate control signal SRC, driver circuit 53 drives AT cable 2 according to the state of transistor p1 between time tr and time (tr+T). Also, driver circuit 53 drives AT cable 2 according to the state of transistors p1 and p2 between time (tr+T) and time (tr+2×T). This drives AT cable 2 at it maximum driving performance obtained by transistors p1 to p3 between the time (tr+2T) and time tf. Also, driver circuit 53 drives AT cable 2 according to the state of transistor n1 between time tf and the timing (tf+T) and according to the state of transistors n1 and n2 between time (tf+T) and the timing (tf+2T). Driver circuit 53 drives AT cable 2 with its maximum current driving performance obtained by transistors n1 to n3, between the time (tf+2T) and the following time tr.

Because the current driving performance is adjusted during a change of transmit signal SIN by delaying the switching timing of transistors p2 and n2 by a time T and the switching timing of transistors p3 and n3 by a time (2×T) in this way, the slew rate of driver circuit 53 takes a value of sr3 (<sr2). Transmit signal SIN thus begins rising from the "L" level at time tr and keeps rising at a slew rate of sr3 to reach the "H" level. And, transmit signal SIN begins falling from the "H" level at time tf and keeps falling at a slew rate of sr3 to reach the "L" level.

As described above, driver circuit 53 is composed so that it controls the switching timings of the CMOS inverter composed of transistors p2 and n2 and the CMOS inverter composed of transistors p3 and n3, thereby changing the slew rates only during the rising period and during the falling period of transmit signal SOUT without changing its current driving performance during both "H" and "L" level periods thereof.

Next, how to create a slew rate setting table for driver circuit 53 will be described. At first, the best slew rate is set beforehand for each signal sending condition comprising a data transfer rate and an ATA cable type. Then, a slew rate setting table in which the best slew rate for each signal sending condition is written is stored beforehand in each of AT controller 14 or main memory 13 of host system 1 and interface controller 31, 41 or memory 33, 43 of peripheral device 3. This procedure is executed, for example, in the manufacturing process of the subject computer system. For peripheral device 3 supplied as a single unit, the procedure is executed in the manufacturing process. In this case, the memory system for storing the slew rate setting table also instructs the controller for setting a slew rate of driver circuit 53 according to each signal sending condition.

For example, the slew rate of driver circuit 53 is changed on each signal sending condition while a signal is sent and the waveform of the signal, as well as the data transfer error occurrence rate are monitored. The best slew rate is decided and tabulated for each signal sending condition so as to be stored in both host system 1 and peripheral device 3.

With reference to FIG. 7, a configuration of the slew rate setting table of driver circuit 53 is illustrated. The table depicted in FIG. 7 is for the driver circuit that can set slew rates in seven or more steps like sr1 (maximum) >sr2>sr3>sr4>sr5>sr6>sr7> . . . In the slew rate value (slew rate standard value) field in the table illustrated in FIG. 7, there are actually recorded bit values of the slew rate control signal SRC. The signal output device reads the bit values of slew rate control signal SRC related to the object signal sending condition from the slew rate setting table and supplies the bit values to driver circuit 53.

A signal output device provided with a slew rate setting table as depicted in FIG. 7 sets sr1 for the slew rate of driver circuit 53 if the data transfer rate is 66.6 MB/s and the cable type is 80C. If the data transfer rate is 44.4 or 33.3 MB/s and the cable type is 80C, the signal output device sets sr2(<sr1) for the slew rate of driver circuit 53. And, if the data transfer rate is 33.3 MB/s and the cable type is 40C, the signal output device sets sr3 (<sr2) for the slew rate of driver circuit 53.

Figure 8:
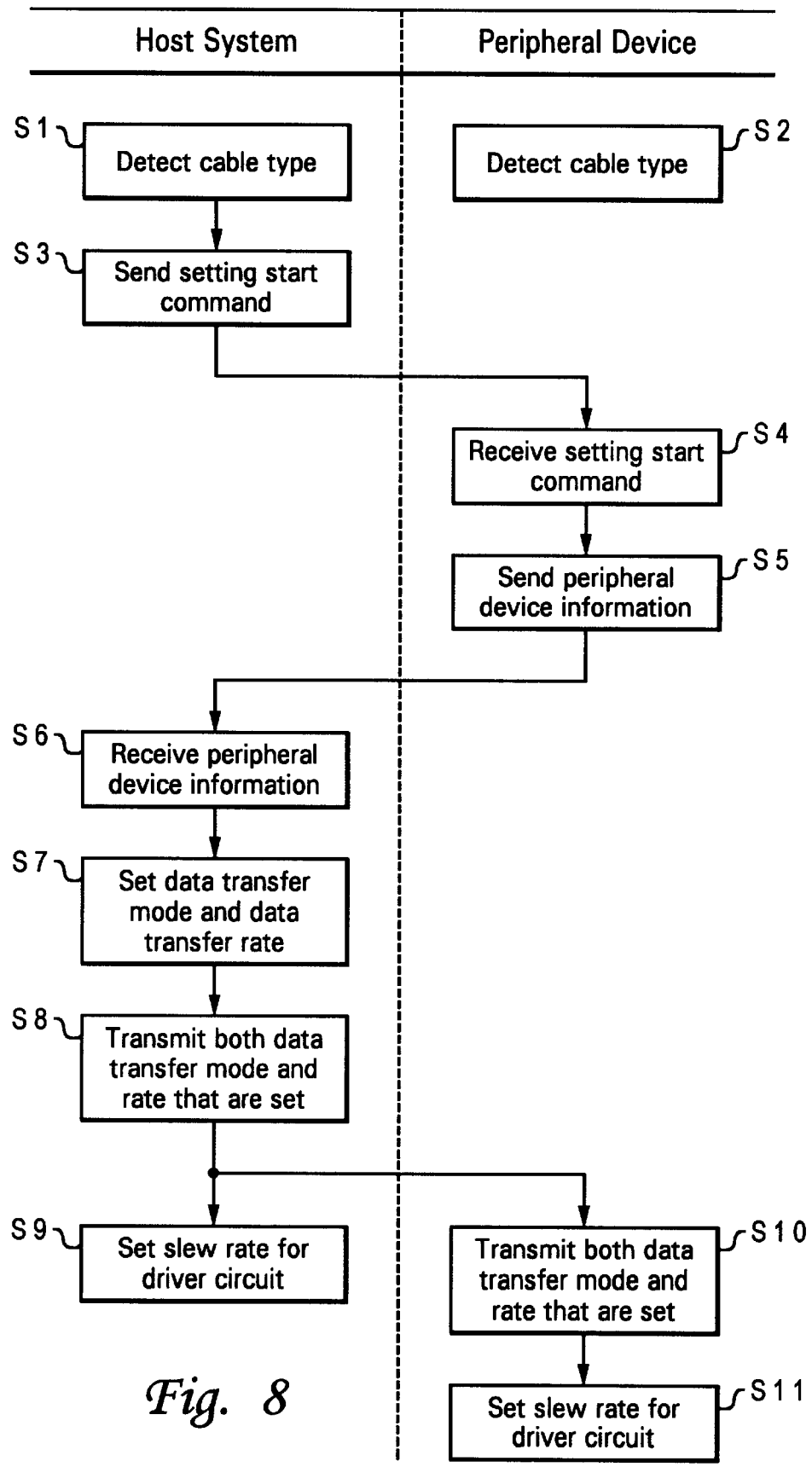
FIG. 8 is a flow chart of procedures for setting both data transfer mode and data transfer rate, as well as a procedure for setting a slew rate of a driver circuit according to a preferred embodiment of the present invention.

Referring to FIG. 8, a flow chart for describing how to set a data transfer mode and a data transfer rate, as well as how to set a slew rate of a driver circuit 53 in a preferred embodiment is illustrated. The setting procedure depicted in FIG. 8 enables commands and data to be sent between host system 1 and peripheral device 3. In this stage, however, none of host system 1 and peripheral device 3 recognizes the information of its partner's device, so the above data transfer is done, for example, in the PIO data transfer mode. If the subject computer system is powered or reset, host system 1 and peripheral device 3 detect the type of ATA cable 2 (40C or 80C cable) in steps S1 and S2.

Detecting the type of ATA cable 2, host system 1 sends a setting start command in the data transfer mode to peripheral device 3 and requests peripheral device 3 to update the information (data transfer modes and data transfer rates supported by peripheral device 3) in step S3.

Receiving the setting start command in step S4, peripheral device 3 notifies host system 1 of its own information such as the data transfer modes and data transfer rates that peripheral device 3 can support in step S5.

Host system 1, receiving the information of peripheral device 3 in step S6, sets a data transfer mode and a data transfer rate to be used in the communication with peripheral device 3 with reference to the data transfer modes and the data transfer rates that peripheral device 3 can support, as well as the type of the ATA cable in use and the data transfer modes and the data transfer rates that host system 1 itself can support in step S7. After that, host system 1 notifies peripheral device 3 of both set data transfer mode and data transfer rate that are set in step S8.

If ATA cable 2 is a 40C cable, host system 1 does not set a data transfer rate of 44.4 MB/s or over which the 80C cable must set, but sets a data transfer rate of 33.3 MB/s or under in step S7 even when host system 1 and peripheral device 3 can support a data transfer rate of 44.4 MB/s or over.

If ATA cable 2 is a 40C cable, peripheral device 3 may notify host system 1 that it can support a data transfer rate of 33.3 MB/s or under in step S5 even when it can support a data transfer rate of 44.4 MB/s or over. Peripheral device 3 may also detect the cable type and it relays the information to peripheral device 3. Or, host system 1 may detect the cable type and relays the information to peripheral device 3.

Next, host system 1 reads the bit value of slew rate control signal SRC from the slew rate setting table stored in main memory 13 or AT controller 14 in step S9. The bit value is used to set the best slew rate on the subject signal sending condition comprising the set data transfer rate and the type of the cable in use. Host system 1 then supplies the read bit values to all driver circuits 53 of driver/receiver unit 14a. Consequently, all driver circuit 53 are set to the best slew rate standard value on the above signal sending condition.

Peripheral device 3, receiving the report of both data transfer mode and data transfer rate that are set in step S10, reads the bit values of slew rate control signal SRC from the slew rate setting table held in memory 33 or 43 and supplies the bit values to all driver circuits 53 of driver/receiver unit 51a (31a or 41a) in step S11. The bit values are used to set the best slew rate on the above signal sending condition comprising the set data transfer rate and the type of the cable in use. Consequently, all driver circuits 53 of driver/receiver unit 51 a are set to the best slew rate standard value on the above signal sending condition.

This completes setting of the data transfer mode and the data transfer rate, as well as setting of the slew rate of those driver circuits. Hereafter, data transfer can be made in the predetermined data transfer mode at a predetermined data transfer rate.

Figure 9A:
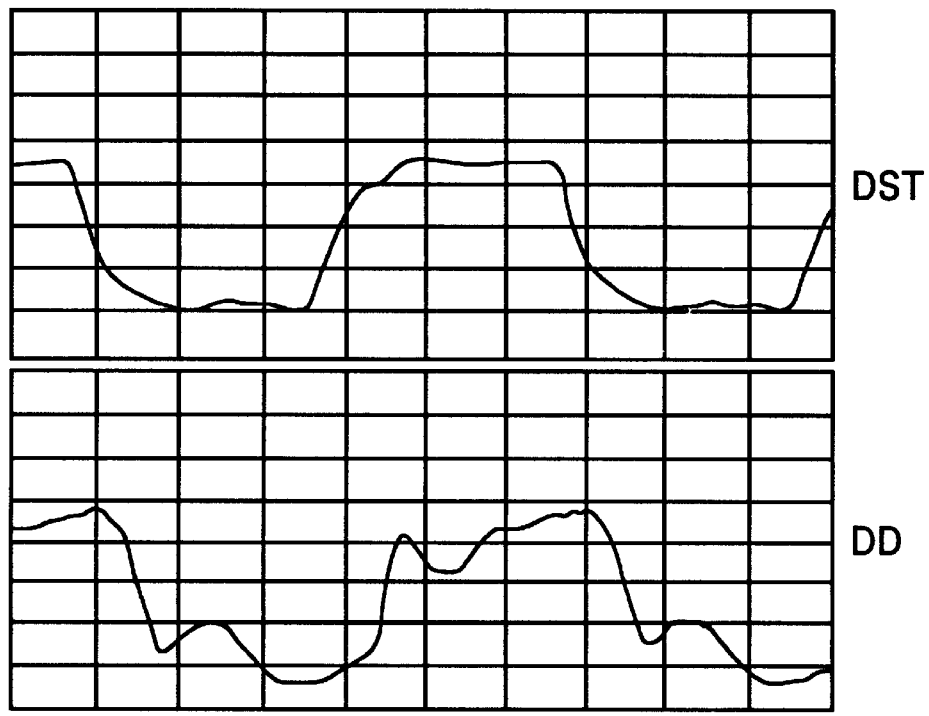
FIG. 9 depicts charts for the comparison between the signal waveform of the signal output device and the signal waveform of the conventional signal output device (at a low data transfer rate) in accordance with a preferred embodiment of the present invention.
Figure 9B:
Figure 10A:
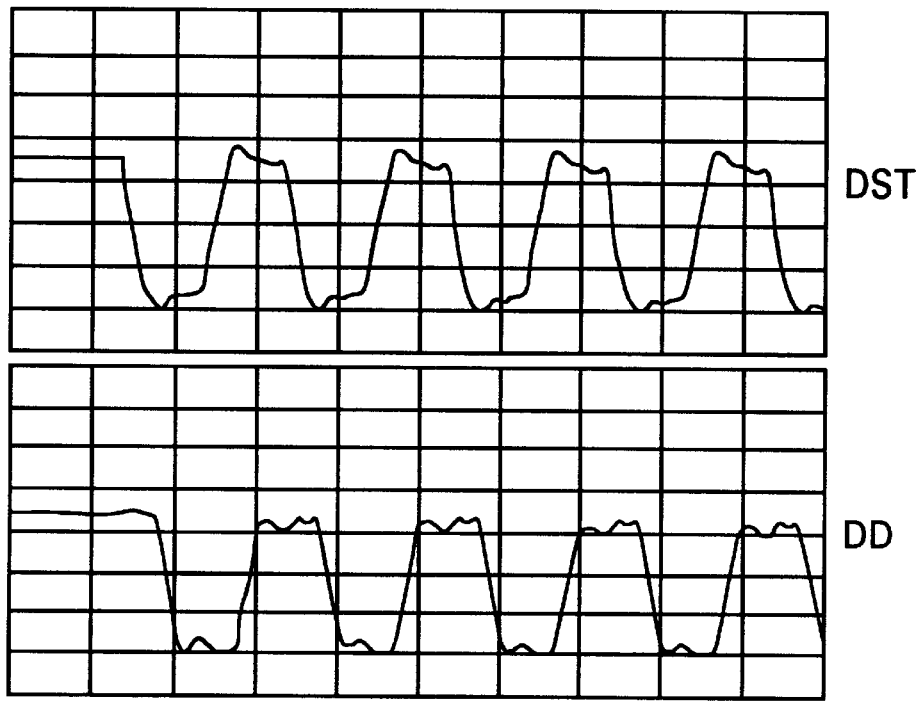
FIG. 10 illustrates charts for the comparison between the signal waveform of the signal output device in a preferred embodiment according to the present invention and the signal waveform of the conventional signal output device (at a high data transfer rate) according to a preferred embodiment of the present invention.
Figure 10B:
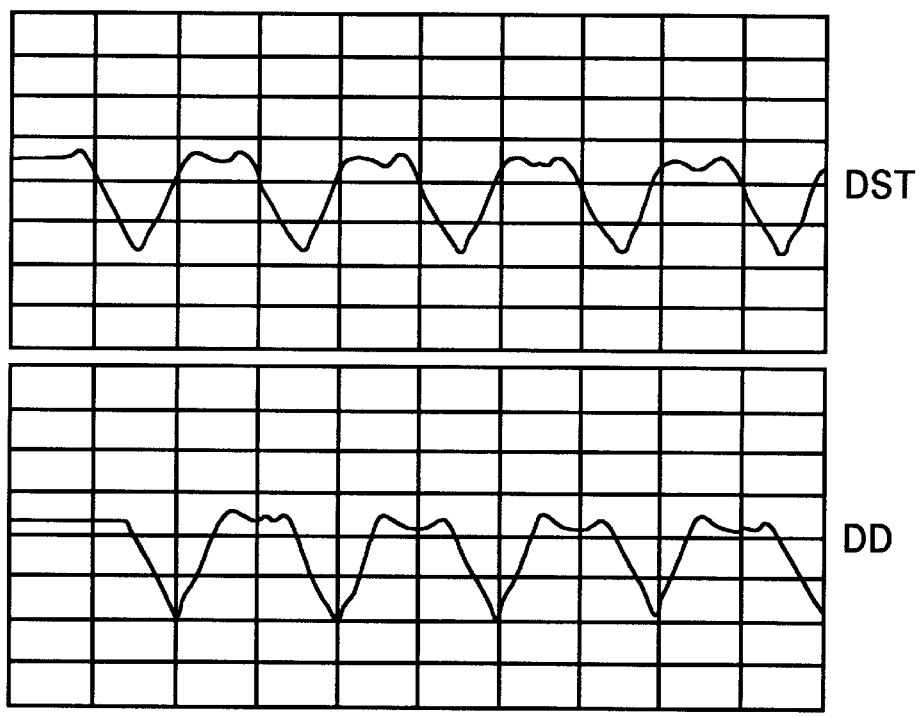

With reference to FIGS. 9 and 10, charts for comparison between the signal waveforms of the signal output device in a preferred embodiment and the signal waveforms of the conventional signal output device are depicted with accordance to the presentation. Illustrated in FIGS. 9 and 10, FIG. 9a and 10a depicts the waveforms of strobe signal DST and the data signal DD output from the signal output device in a preferred embodiment and FIGS. 9b and 10b illustrates the waveforms of strobe signal DST and the data signal DD output from the conventional signal output device. The scales of the time axis (horizontal) and the potential axis (vertical) depicted in FIGS. 9 and 10 are identical. The data transfer rate illustrated in FIG. 9 is assumed to be VD1 and the data transfer rate depicted in FIG. 10 is assumed to be VD2 (>VD1).

The slew rate of driver circuit of the signal output device in a preferred embodiment is set to best value sra in FIG. 9a and to best value srb (>sra) in FIG. 10a. The slew rate of the driver circuit of the conventional signal output device is fixed and FIG. 9b shows the signal waveform output from the driver circuit whose slew rate is fixed to srb. FIG. 10b shows the signal waveform output from the driver circuit whose slew rate is fixed to sra.

Because a small slew rate value sra is set for the driver circuit 53 in a preferred embodiment illustrated in FIG. 9a, crosstalk is reduced. Also, data can be latched correctly at both start and end of strobe signal DST in the signal receiving circuit. However, because the slew rate is fixed to a large value srb for the conventional driver circuit depicted in FIG. 9b, large crosstalk noise remains in data signal DD. Consequently, wrong data may possibly be latched at both start and end of strobe signal DST in the signal receiving circuit.

Furthermore, because the driver circuit in an embodiment illustrated in FIG. 11a is set to a large slew rate value srb, both "L" and "H" level periods are secured for both strobe signal DST and data signal DD. Data signal DD is set on the "L" or "H" level at both start and end of strobe signal DST. Consequently, data can be latched correctly in the signal receiving device. Because the conventional driver circuit depicted in FIG. 10b is fixed to a small slew rate value sra, the "L" level period is not secured enough for both strobe signal DST and data signal DD. Consequently, wrong data may possibly be latched.

Figure 11:
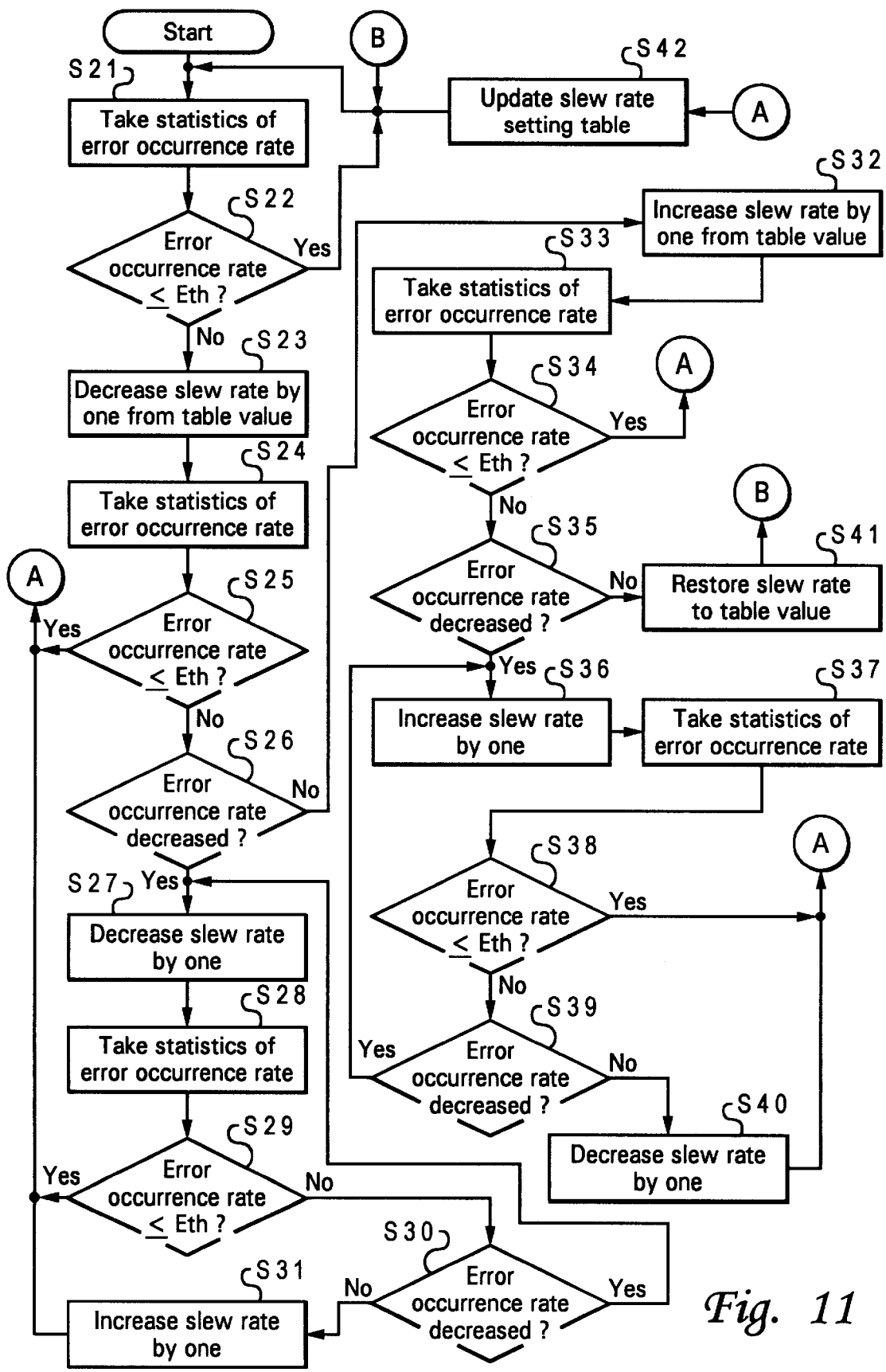
FIG. 11 is a flow chart of the procedure for correcting a slew rate according to a preferred embodiment of the present invention.

With reference to FIG. 11, a flow chart for describing how to correct a slew rate in a preferred embodiment is illustrated. At first, if data transfer is started in a data transfer mode, a data transfer rate, and at a slew rate standard value of the driver circuit set respectively in the procedure shown in FIG. 8, the signal I/O devices of both host system 1 and peripheral device 3 start a statistical processing of the data transfer error occurrence rate of errors detected in data transfer between host system 1 and peripheral device 3 in step S21 illustrated in FIG. 11.

The signal output device which outputs data delimits transmit data at a given length and adds an error correction code to each delimited data before sending it. In this case, the error correction code is a CRC (Cyclic Redundancy Check) code. The CRC code can verify whether or not the object data is correct. It can also correct an error within the predetermined number of bits. Such error verification by the CRC code is done in peripheral device 3 in the data transfer between host system 1 and peripheral device 3.

For example, when data is sent from the signal output device of peripheral device 3 to the signal receiving device of host system 1, the signal receiving device of host system 1 calculates the data used for CRC verification according to the received CRC code attached data. It relays this CRC verification data to the signal output device of peripheral device 3. The signal output device of peripheral device 3 also calculates the CRC verification data about the CRC code word sent to host system 1 separately, so the signal output device of peripheral device 3 executes CRC verification according to the CRC verification data calculated by itself and the CRC verification data received from host system 1, thereby determining whether or not a sending error has occurred. Peripheral device 3 sends the result to host system 1 and takes statistics of the sending error occurrence rate. If a sending error is detected, peripheral device 3 sends the same data again and executes other necessary instructions.

When data is sent from the signal output device of host system 1 to the signal receiving device of peripheral device 3, the signal receiving device of peripheral device 3 executes CRC verification according to the received CRC code word so as to determine whether a sending error has occurred. Host system 1 relays the result to host system 1 and takes statistics of the sending error occurrence rate. If a sending error is detected, host system 1 sends the same data again and executes other necessary instructions.

Next, each signal I/O device determines whether or not the sending error occurrence rate is below an allowable threshold Eth in step S22. The determination in this step S22 is done each time the predetermined number of CRC code attached data items is sent or each time data is sent by the predetermined number of times or at a predetermined time interval. The allowable threshold Eth is 0 or another predetermined value. If the sending error occurrence rate is below the allowable threshold Eth, control returns to step S21. If the allowable threshold Eth is exceeded, control goes to step S23.

If the sending error occurrence rate is over the allowable threshold Eth in step S22, the subject signal I/O device decreases the slew rate of driver circuit 53 by one from the set standard value in the slew rate setting table (table value) in step S23.

Next, the signal I/O device takes statistics of the sending error occurrence rate after the change of the slew rate in step S24 in the same procedure as that in step S21, then determines whether or not the sending error occurrence rate is below the allowable threshold Eth after the change of the slew rate in step S25 in the same procedure as that in step S22. If the sending error occurrence rate is below the allowable threshold Eth after the change of the slew rate, control goes to step S42. If it is over the allowable threshold Eth, control goes to step S26.

If the sending error occurrence rate is below the allowable threshold Eth after the change of the slew rate in step S25, in step S42, the subject signal I/O device updates the slew rate standard value of the object signal sending condition in the slew rate setting table to the value changed in step S23. The control of the process returns to step S21.

If the sending error occurrence rate is determined to be over the allowable threshold Eth after the change of the slew rate in step S25, then the signal I/O device determines in step S26 whether or not the sending error occurrence rate after the change of the slew rate is decreased from that before the change of the slew rate. If it is determined to be decreased, control goes to step S27 and if not, control goes to step S32.

If it is determined in step S26 that the sending error occurrence rate after the change of the slew rate is decreased from that before the change of the slew rate, then the signal I/O device decreases the slew rate of the driver circuit 53 by one in step S27. Then, in step S28, the signal I/O device takes statistics of the sending error occurrence rate after the slew rate is changed in step S27 in the same procedure as that in step S21. After that, in step S29, the signal I/O device determines whether or not the sending error occurrence rate is below the allowable threshold Eth after the slew rate is changed in step S27 in the same procedure as that in step S22. If it is below the allowable threshold Eth, control goes to step S42, where the slew rate standard value of the signal sending condition in the slew rate setting table is updated to the value changed in step S27. If it is over the allowable threshold Eth, control goes to step S30.

In step S30, the signal I/O device determines whether or not the sending error occurrence rate after the slew rate is changed in step S27 is decreased from that before the change of the slew rate. If it is decreased, control returns to step S27 and the signal I/O device further decreases the slew rate of the driver circuit 53 by one and if not, control goes to step S31.

In step S31, the signal I/O device increases the slew rate of the driver circuit 53 by one from the current value to a slew rate that minimizes the sending error occurrence rate within a smaller value than the table value. After this, control goes to step S42 and the signal I/O device updates the slew rate standard value of the object signal sending condition in the slew rate setting table to the value changed in step S31. Control then returns to step S21.

Next, if it is determined in step S26 that the sending error occurrence rate after the change of the slew rate is not decreased from that before the change of the slew rate, the signal I/O device increases the slew rate of the driver circuit 53 by one from the standard value set in the slew rate setting table (table value) in step S32.

Next, in step S33, the signal I/O device takes statistics of the sending error occurrence rate after the slew rate is changed in step S32 in the same procedure as that in step S21 and determines in step S34 whether or not the sending error occurrence rate is below the allowable threshold Eth after the slew rate is changed in step S32 in the same procedure as that in step S22. Then, if the sending error occurrence rate is below the allowable threshold Eth after the slew rate is changed in step S32, control goes to step S42. If not, control goes to step S35.

If it is determined in step S34 that the sending error occurrence rate is below the allowable threshold Eth, in step S42, the signal I/O device updates the slew rate standard value of the object signal sending condition in the slew rate setting table to the value changed in step S32. Control then returns to step S21.

If it is determined in step S34 that the sending error occurrence rate is over the allowable threshold Eth, the signal I/O device determines whether or not the sending error occurrence rate after the slew rate is changed in step S32 is decreased from that before the change in step S35. If it is decreased, control goes to step S36 and if not, control goes to step S41.

If it is determined in step S35 that the sending error occurrence rate is not decreased from before the slew rate is changed, the signal I/O device returns the slew rate of the driver circuit 53 to the standard value set in the slew rate setting table (table value) in step S41. Control then returns to step S21.

If it is determined in step S35 that the sending error occurrence rate is decreased from that before the slew rate is changed, the signal I/O device further increases the slew rate of the driver circuit 53 by one in step S36, then in step 37 takes statistics of the sending error occurrence rate after the slew rate is changed in step S36 in the same procedure as that in step S21 and determines in step S38 whether or not the sending error occurrence rate is below the allowable threshold Eth after the slew rate is changed in step S36 in the same procedure as that in step S21. If it is below the allowable threshold Eth, control goes to step S42 and updates the slew rate standard value of the object signal sending condition in the slew rate setting table to the value changed in step S36. If not below the allowable threshold Eth, control continues to step S39.

The signal I/O device determines in step S39 whether or not the sending error occurrence rate after the slew rate is changed in step S36 is decreased from that before the change. If it is decreased, control returns to step S36 and the signal I/O device further increases the slew rate of the driver circuit 53 by one. If not decreased, control continues to step S40.

In step S40, the signal I/O device decreases the slew rate of the driver circuit 53 by one from the current value to a slew rate that minimizes the sending error rate within a larger value than the table value. Control then goes to step S42 and updates the slew rate standard value of the object signal sending condition in the slew rate setting table to the value changed in step S40. Control then returns to step S21.

As described above, the procedure illustrated in FIG. 11 changes the slew rate in the following steps:

setting the slew rate of driver circuit 53 to a standard value according to the predetermined data transfer rate, then starting signal transmission;

determining whether or not the data transfer error occurrence rate is below the allowable threshold Eth while the data transfer error occurrence is caused by a signal sent to the signal receiving device from driver circuit 53 (steps S21 and S22);

changing the slew rate of driver circuit 53 if it is determined that the sending error occurrence rate is over the allowable threshold Eth;

searching a slew rate value that decreases the sending error occurrence rate below the allowable threshold Eth or decreases the sending error occurrence rate (steps S23 to S40);

setting the searched slew rate value as a new standard value if the slew rate value decreases the sending error occurrence rate below the allowable threshold Eth or decreases the sending error occurrence rate (step S42);

the step of changing the slew rate that decreases the sending error occurrence rate below the allowable threshold Eth or further decreases it is also divided into the following steps;

decreasing the slew rate of driver circuit 53 from the standard value if the sending error occurrence rate is over the allowable threshold Eth, then determining whether or not the sending error occurrence rate is decreased (steps S23 to S26);

searching a slew rate value that decreases the sending error occurrence rate below the allowable threshold Eth or minimizes it within a smaller value than the standard value if the sending error occurrence rate is decreased (steps S25 and S27 to S31);

increasing the slew rate from the standard value if the sending error occurrence rate is not decreased, then determining whether or not the sending error occurrence rate is decreased (steps S32 to S35); and searching a slew rate value that decreases the sending error occurrence rate below the allowable threshold Eth or minimizes it within a larger value than the standard value if the sending error occurrence rate is decreased (steps S34 and S36 to S40).

The slew rate correction procedure described above is also effective to obtain high signal integrity on every signal sending condition even when the slew rate standard value set in the slew rate setting table is not the best and the best slew rate is changed dynamically.

According to a preferred embodiment described above, because the signal output device is composed so as to include a driver circuit that can set a plurality of different slew rates and can set the best slew rate according to each signal sending condition comprising a predetermined data transfer rate and a type of the cable in use, high signal integrity can be obtained on each signal sending condition.

Furthermore, because the data transfer error occurrence rate is monitored while the error occurrence is caused by a signal sent to a signal receiving device from a driver circuit and the slew rate of the driver circuit is changed to a value that can decrease the sending error occurrence rate below a predetermined allowable threshold or decrease it more if the sending error occurrence rate is over the predetermined allowable threshold, high signal integrity can be obtained on each signal sending condition even when the object slew rate standard value set in the slew rate setting table is not the best and the best slew rate is changed dynamically.

Although the best slew rate is set according to a predetermined data transfer rate and a type of the cable in use in a preferred embodiment as described above, the signal output device may be composed so as to set the best slew rate according to only a data transfer rate.

The best slew rate that can obtain high signal integrity also depends on the number of peripheral devices connected to the same cable. Consequently, the best slew rate may be set according to a signal sending condition. The condition consists of a data transfer rate and a type of the cable in use that are set according to the number of peripheral devices connected to the same cable and detected by the signal output device of the host system or a peripheral device, as well as the number of the peripheral devices connected to the same cable.

The electrical properties (mutual conductance, threshold voltage, etc.) should preferably be the same between pMOS transistors and nMOS transistors of a driver circuit. However, those electrical properties may possibly be different between the pMOS transistors and nMOS transistors due to various conditions including the manufacturing process, etc. in some cases. In such a case, the same slew rate cannot be obtained at both start and end of an output signal of the driver circuit if the same timing is set for switching both a plurality of pMOS transistors and a plurality of nMOS transistors of the driver circuit as illustrated in FIG. 5 in a preferred embodiment described above.

In order to avoid such problems, the signal output device in another preferred embodiment includes a driver circuit that can adjust a slew rate at the start of its output signal from the driver circuit and a slew rate at the end of its output signal separately, thereby the same slew rate can be set at both start and end of its output signal even when electrical properties are different between transistors thereof.

Figure 12:
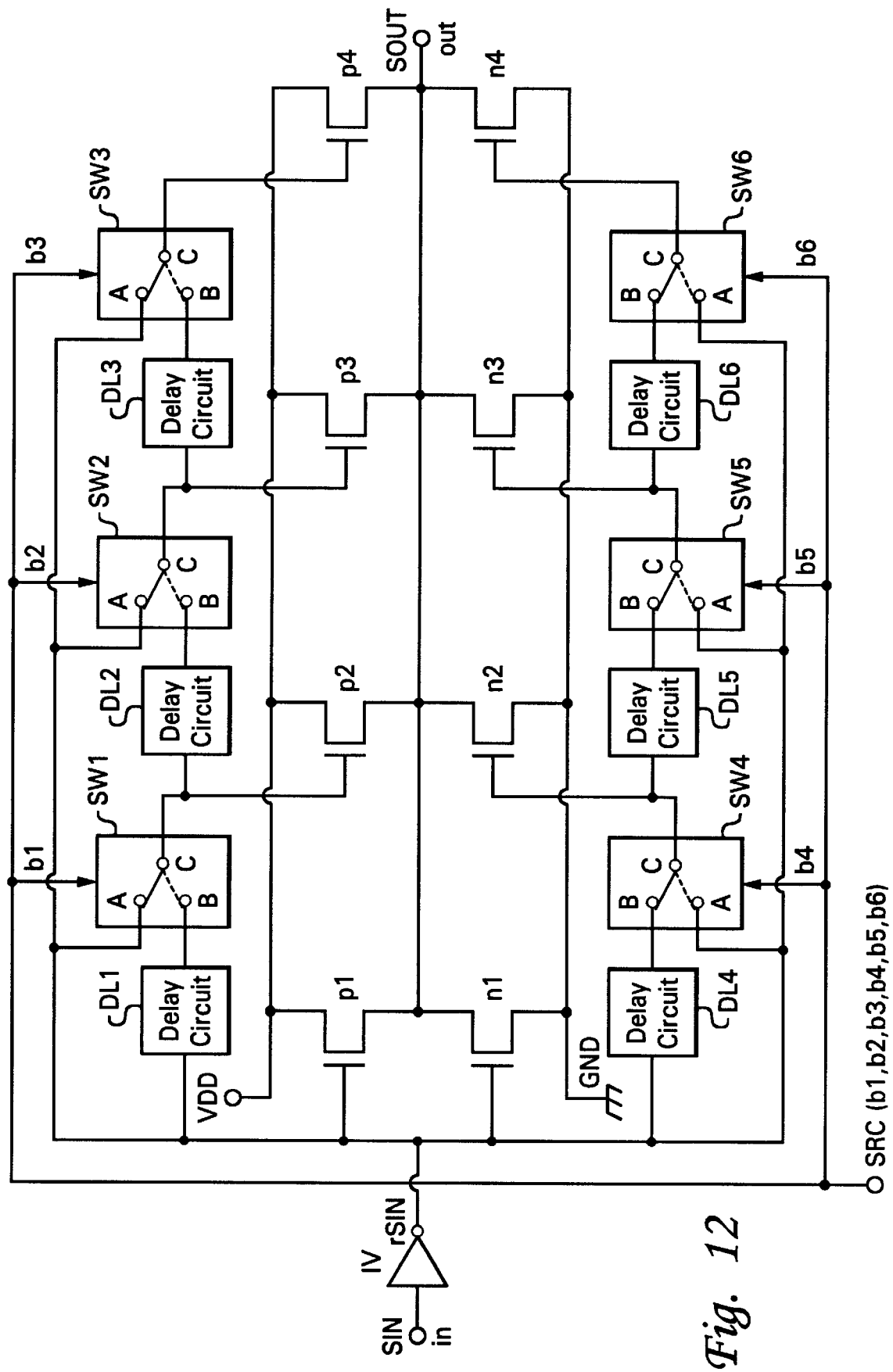
FIG. 12 is a circuit diagram of a driver circuit provided in the signal output device in accordance with a preferred embodiment of the present invention.

FIG. 12 depicts a block diagram of a driver circuit of the signal output device in another preferred embodiment according to the present invention. Referencing FIG. 12, the same symbols are given to the same parts as those illustrated in FIG. 5. The driver circuit depicted in FIG. 12 is provided with pMOS transistors p1 to p4, nMOS transistors n1 to n4, delay circuits DL1 to DL6, switching circuits SW1 to SW6, and an inverter IV.

In the driver circuit illustrated in FIG. 12 is composed so that the switching timing of each of pMOS transistors p1 to p4 can be adjusted separately from that of each of the nMOS transistors n1 to n4. The slew rate at the start of its output signal can be adjusted separately from that at the end of the output signal. Delay circuits DL1 to DL3 and switching circuits SW1 to SW3 comprise a device for setting a slew rate at the start of the output signal from the driver circuit when the switching timing of each of pMOS transistors p1 to p4 is set according to the values of bits b1 to b3 of slew rate control signal SRC. Delay circuits DL4 to DL6 and switching circuits SW4 to SW6 are combined so as to comprise another device for setting a slew rate at the end of an output signal from the driver circuit when the switching timing of each of nMOS transistors n1 to n4 is set according to the values of bits b4 to b6 of slew rate control signal SRC.

Because the slew rate at the start of an output signal from the driver circuit can be adjusted separately from that at the end of the output signal as described above, the same slew rate can be set for both start and end of the output signal even when the electrical properties differ between pMOS transistors and nMOS transistors.

Inverter IV inverts transmit signal SIN entered to signal input terminal "in" from the controller, which supplies inverted transmit signal rSIN to the gate electrodes of transistors p1 and n1, the input terminals of delay circuits DL1 and DL4, as well as to terminals A of switching circuits SW1 to SW6.

Delay circuit DLk delays an input signal and supplies the delayed signal to terminal B of switching circuit SWk. In this case, the signal delay time of each of delay circuits DL1 to DL6 is assumed to be T.

Slew rate control signal SRC entered to terminal src from the interface controller is used to set a slew rate of the driver circuit. It is a 6-bit signal comprising b1 to b6. Bit bk (k=1, 2, . . . 6) of slew rate control signal SRC is entered to switching circuit SWk. Bits b1 to b3 are signals for controlling the switching timing of pMOS transistors p1 to p4 so as to set a slew rate at the start of an output signal from the driver circuit. Bits b4 to b6 are signals for controlling the switching timing of nMOS transistors n1 to n4 so as to set a slew rate at the end of the output signal.

Switching circuit SWk connects terminal C to terminal A or B according to the logical value of bit bk of slew rate control signal SRC. In this case, switching circuit SWk connects terminal C to terminal A at bk="0" and to terminal B at bk="1." Terminals C of switching circuits SW1 to SW3 are connected to the gate electrodes of pMOS transistors p2 to p4 respectively. Terminals C of switching circuits SW4 to SW6 are connected to the gate electrodes of nMOS transistors n2 to n4 respectively.

The source electrodes of transistors p1 to p4 are connected to power supply VDD and the drain electrodes are connected to output terminal "out" respectively. The source electrodes of transistors n1 to n4 are connected to ground GND and the drain electrodes are connected to output terminal "out" respectively. Output terminal "out" is connected to AT cable 2 (see FIGS. 3 and 4) and transmit signal SOUT output from the driver circuit at a predetermined slew rate is supplied to AT cable 2.

Transistor p1 is switched according to transmit signal rSIN and transistor p2 is switched according to a signal supplied from switching circuit SW1. Transistor p3 is switched according to a signal supplied from switching circuit SW2. Transistor p4 is switched according to a signal supplied from switching circuit SW3. Transistor n1 is switched according to transmit signal rSIN. Transistor n2 is switched according to a signal supplied from switching circuit SW4. Transistor n3 is switched according to a signal supplied from switching circuit SW5. Transistor n4 is switched according to a signal supplied from switching circuit SW6.

FIG. 13 illustrates a table for describing the operation of the driver circuit depicted in FIG. 12. The table illustrates the correspondence between set values of switching circuits SW1 to SW6 and the slew rates of the object driver circuit. As depicted in FIG. 13, the driver circuit illustrated in FIG. 12 enables the same slew rate to be set at both start and end of its output signal, as well as in the four steps of sr1 (max.), sr2 (<sr1), sr3 (<sr2), and sr4 (<sr3) according to the slew rate control signal SRC (bits b1 to b6).

The driver circuit depicted in FIG. 12 enables the slew rate at the start of its output signal to be set in five steps according to the set values of switching circuits SW1 to SW3 and the slew rate at the end of its output signal to be set in five steps according to the set values of switching circuits SW4 to SW6.

For example, if SW1–3=(ABA) is described for a case that switching circuit SW1 is set to terminal A, terminal B, and terminal A, then the slew rate at the start of an output signal will be as shown below.

| | |
|---|---|
| At SW1-3 = (AAA) | . . . rsr1 (max.) |
| At SW1-3 = (AAB) | . . . rsr2 (<rsr1) |
| At SW1-3 = (BAB) | . . . rsr3 (<rsr2) |
| At SW1-3 = (ABB) | . . . rsr4 (<rsr3) |
| At SW1-3 = (BBB) | . . . rsr5 (<rsr4) |

At SW1–3=(ABA) and (BAA), rsr2 is assumed to be like at SW1–3=(AAB). At SW1–3=(BBA), rsr4 is assumed to be like at SW1–3=(ABB).

In the same way, the slew rate at the end of an output signal from the driver circuit will be as shown below.

| | |
|---|---|
| At SW4-6 = (AAA) | . . . fsr1 (max.) |
| At SW4-6 = (AAB) | . . . fsr2 (<fsr1) |
| At SW4-6 = (BAB) | . . . fsr3 (<fsr2) |
| At SW4-6 = (ABB) | . . . fsr4 (<fsr3) |
| At SW4-6 = (BBB) | . . . fsr5 (<fsr4) |

The driver circuit shown in FIG. 12 disables the same slew rate to be set at both start and end of its output signal due to a difference of electrical properties (mutual conductance, threshold voltage, etc.) between pMOS transistors p1 to p4 and nMOS transistors n1 to n4 when the same switching timing is set for pMOS transistors p1 to p4 and NMOS transistors n1 to n4. It is assumed that the slew rate becomes like fsr1>rsr1 fsr2>rsr2 1fsr3>rsr3 1fsr4>rsr4 1fsr5>rsr5 when the slew rates rsr1 to rsr5 at the start and slew rates fsr1 to fsr5 at the end of an output signal from the driver circuit are observed at each switch setting.

FIG. 13 illustrates a table for describing setting of the switching circuits of the driver circuit in the above case. When SW1–3=(AAA) and SW4–6=(AAB) are set, the same sr1 (max.) (=rsr1=fsr2) is set for the slew rate of both start and end of an output signal from the driver circuit. When SW1–3=(AAB) and SW4–6=(BAB) are set, the same sr2 (=rsr2=fsr3<sr1) is set for the slew rate of both start and end of an output signal from the driver circuit. When SW1–3=(BAB) and SW4–6=(ABB) are set, the same sr3 (=rsr3=fsr4<sr2) is set for the slew rate of both start and end of an output signal from the driver circuit. And, when SW1–3=(ABB) and SW4–6=(BBB) are set, the same sr4 (=rsr4=fsr5<sr3) is set for the slew rate of both start and end of an output signal from the driver circuit.

In the above case, the driver circuit shown in FIG. 12 can adjust the slew rate in four steps of sr1 to sr4. Any of the above switch settings is written as the best slew rate (standard value) to each signal sending condition in the slew rate setting table (refer to FIG. 7). For example, if sr1 is set for the slew rate of the driver circuit, SW1–3=(AAA) and SW4–6=(AAB) switch settings are written.

For example, if slew rate control signal SRC is set to b1=b2="0," b3=b4="1," b5="0," and b6="1" and switching circuits SW1, SW2, and SW5 are set to terminal A and switching circuits SW3, SW4, and SW6 are set to terminal B respectively, the driver circuit illustrated in FIG. 12 will operate at a slew rate of sr2 at both start and end of the output signal. At this time, the inverted transmit signal rSIN is supplied to the gate electrodes of transistors p1 to p3 and n1 and n3 while a signal delayed by a time T from inverted transmit signal rSIN is supplied to the gate electrodes of transistors p4, n2, and n4 respectively.

When the level of transmit signal SIN is changed from "L" to "H," transistors p1 to p3 are turned on and transistors n1 and n3 are turned off. A time T after that, transistor p4 is turned on and transistors n2 and n4 are turned off. With the switching operations of those transistors, the level of the transmit signal SOUT is changed from "L" to "H."

When the level of transmit signal SIN is changed from "H" to "L," transistors p1 to p3 are turned off and transistors n1 and n3 are turned on. A time T after that, transistor p4 is turned off and transistors n2 and n4 are turned on. With the switching operations of those transistors, the level of the transmit signal SOUT is changed from "H" to "L."

Consequently, when the level of transmit signal SIN is changed from "L" to "H," the driver circuit drives AT cable 2 according to the switching states of transistors p1 to p3, then a time T after that, the driver circuit drives AT cable 2 with its maximum current driving performance obtained by transistors p1 to p4. Therefore, the driver circuit operates at a slew rate of sr2(rsr2) at the start of its output signal. When the level of transmit signal SIN is changed from "H" to "L," the driver circuit drives AT cable 2 first according to the switching states of transistors n1 and n3, then a time T after that, the driver circuit drives AT cable 2 with its maximum current driving performance obtained by transistors n1 to n4, thereby the driver circuit operates at a slew rate of sr2(=sr3) at the end of its output signal.

In accordance with another embodiment the driver circuit is composed so that the slew rate at the start of its output signal can be adjusted separately from the slew rate of the end of the output signal, it is possible to set the best slew rate on each signal sending condition, thereby obtaining high signal integrity on each signal sending condition, as well as it is possible to set the same slew rate at both start and end of the output signal even when the electrical properties are different between transistors composing the driver circuit.

What is claimed is:

1. A signal output device, comprising:
   a driver circuit for setting a plurality of different slew rates and relaying a signal to a signal sending line at a selected slew rate among said plurality of different slew rates;
   a controller for selecting said selected slew rate of said driver circuit according to a predetermined data transfer rate, wherein said controller sets said selected slew rate of said driver circuit according to said predetermined data transfer rate and a type of said signal sending line, and wherein said controller includes:
      a memory system for storing a table containing a slew rate for each predetermined data transfer rate; and
      said slew rate of said driver circuit set with reference to said table.

2. The signal output device, according to claim 1, wherein said driver circuit is included on an integrated circuit with at least part of said controller.

3. The signal output device according to claim 1, wherein said driver circuit further comprises:
   a plurality of CMOS circuits; and
   a setting device for delaying a switching timing of each of a plurality of said CMOS circuits to control a wave shape of a transmission by a delay time set according to a control signal from said controller, said setting device including a delay circuit and a switching circuit.

4. The signal output device, according to claim 1, wherein said controller monitors a rate of data transfer error occurrence caused by a signal sent to a signal receiving device from said driver circuit and changes said slew rate of said driver circuit to a value that can decrease said data transfer error occurrence rate below a predetermined allowable threshold.

5. A signal output device, comprising:

a driver circuit for setting a plurality of different slew rates and relaying a signal to a signal sending line at a selected slew rate among said plurality of different slew rates; and a controller for selecting said selected slew rate of said driver circuit according to a predetermined data transfer rate, wherein said circuit can adjust a first slew rate at the start of its output signal separately from a second slew rate at the end of said output signal.

6. The signal output device, according to claim 5, wherein said driver circuit further, comprises:

a plurality of first conductive transistors provided between a signal output terminal and a first power supply;

a plurality of second conductive transistors placed between said signal output terminal and a second power supply;

a first setting device for setting a turn-on timing of each of a plurality of said first conductive transistors according to a first control signal from said signal output device if the level of an inputted signal is changed from a first level to a second level; and a second setting device for setting a turn-on timing of each of a plurality of said second conductive transistors according to a second control signal from said signal output device if the level of said inputted signal is changed from said second level to said first level.

7. A signal sending system, enabling a signal to be sent to a host system via a signal sending line, comprising:

a signal output device that can set a plurality of different data transfer rates and send a signal to an object device via a signal sending line at a selected data transfer rate, said signal output device including:

a driver circuit for setting a plurality of different slew rates and relaying a signal to a signal sending line at a predetermined slew rate; and a controller for setting a slew rate of said driver circuit according to a predetermined data transfer rate from a signal output device provided for a host system, wherein said controller comprises means to set a slew rate of said driver circuit according to said selected data transfer rate, a type of said signal sending line, and a quantity of peripheral devices connect to said signal sending line.

8. The signal sending system, according to claim 7, wherein said signal sending system conforms to the ATA interface standard.

9. The signal sending system, according to claim 7, wherein said signal sending line is one of a plurality of signal sending lines included in a flat cable.

10. The signal sending system, according to claim 7, further comprising a peripheral device selected from the group consisting of a hard disk drive (HDD), a compact disc read only memory (CD-ROM) drive and a digital video disc (DVD) drive.

11. The signal sending system, according to claim 7, wherein said signal output device is mounted on a card of a peripheral device or on the mother board of said host system.

12. The signal sending system, according to claim 7, wherein said signal output device is mounted on a mother board of said host system.

13. A system for sending a signal, said system comprising:

means for setting a slew rate of a driver circuit to a standard value in accordance with a selected data transfer rate;

means for sending a signal from said driver circuit;

means for determining whether or not a data transfer error occurrence rate of said signal is above a predetermined allowable threshold; and means for setting said slew rate of said driver circuit to a slew rate value different from said standard slew rate value if said sending error occurrence rate is over said allowable threshold, said different slew rate value being smaller or larger than said standard slew rate value.

14. The system of claim 13, said system further comprising:

means for setting said slew rate of said driver circuit as a standard value that is in accordance with a signal sending condition comprising said selected data transfer rate and a signal sending line type.

15. The system of claim 13, further comprising means for adding an error correction code to data to be sent by a signal before sending said data to said signal receiving device.

16. The system of claim 15, wherein said error correction code is a Cyclic Redundancy Check code.

17. A method for sending a signal, said method comprising:

setting a slew rate of a driver circuit to a standard value in accordance with a selected data transfer rate;

sending a signal from said driver circuit;

determining whether or not a data transfer error occurrence rate of said signal is above a predetermined allowable threshold; and setting said slew rate of said driver circuit to a slew rate value different from said standard slew rate value if said sending error occurrence rate is over said allowable threshold, said different slew rate value being smaller or larger than said standard slew rate value.

18. The method for sending a signal according to claim 17, said method further comprising:

setting said slew rate of said driver circuit as a standard value that is in accordance with a signal sending condition comprising said selected data transfer rate and a signal sending line type.

19. The method for sending a signal according to claim 17, further comprising adding an error correction code to data to be sent by a signal before sending said data to said signal receiving device.

20. The method for sending a signal according to claim 19, wherein said error correction code is a Cyclic Redundancy Check code.

* * * * *